United States Patent
Park et al.

(10) Patent No.: US 11,036,421 B2
(45) Date of Patent: Jun. 15, 2021

(54) APPARATUS AND METHOD FOR RETAINING FIRMWARE IN MEMORY SYSTEM

(71) Applicant: SK hynix Inc., Gyeonggi-do (KR)

(72) Inventors: Jeen Park, Gyeonggi-do (KR); Jung-Ae Kim, Gyeonggi-do (KR); Duk-Rae Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/531,700

(22) Filed: Aug. 5, 2019

(65) Prior Publication Data
US 2020/0089410 A1 Mar. 19, 2020

(30) Foreign Application Priority Data
Sep. 17, 2018 (KR) .................. 10-2018-0110841

(51) Int. Cl.
| | |
|---|---|
| *G06F 3/06* | (2006.01) |
| *G11C 29/12* | (2006.01) |
| *G06F 11/36* | (2006.01) |
| *G11C 16/30* | (2006.01) |
| *G11C 16/10* | (2006.01) |

(52) U.S. Cl.
CPC .............. *G06F 3/065* (2013.01); *G06F 3/064* (2013.01); *G06F 3/0614* (2013.01); *G06F 3/0652* (2013.01); *G06F 3/0673* (2013.01); *G06F 11/3604* (2013.01); *G06F 11/3624* (2013.01); *G06F 11/3664* (2013.01); *G11C 16/10* (2013.01); *G11C 16/30* (2013.01); *G11C 29/12* (2013.01)

(58) Field of Classification Search
CPC . G06F 3/06; G06F 11/46; G11C 16/10; G11C 16/30; G11C 29/12
USPC ........................................................... 711/154
See application file for complete search history.

(56) References Cited

U.S. PATENT DOCUMENTS

| | | | |
|---|---|---|---|
| 7,536,498 B2 * | 5/2009 | Lee .................. | G06F 12/10 711/2 |
| 2003/0149851 A1 * | 8/2003 | Shiota ............... | G06F 21/79 711/163 |
| 2009/0271603 A1 | 10/2009 | Wang | |
| 2012/0042307 A1 * | 2/2012 | Shao ................. | G06F 9/4406 717/168 |
| 2012/0110562 A1 * | 5/2012 | Heinrich ........... | G06F 8/65 717/169 |

(Continued)

FOREIGN PATENT DOCUMENTS

KR 10-0828755 5/2008

*Primary Examiner* — Christopher B Shin
(74) *Attorney, Agent, or Firm* — IP & T Group LLP

(57) ABSTRACT

A memory system includes a memory device including plural memory blocks divided into a system region, a user data region and a reserved region. The system region includes a first block storing original firmware and a second block storing copied firmware, and the reserved region includes a dedicated test block having an operational characteristic that substantially the same as that of the second block. The memory system includes a controller configured to access the dedicated test block for determining a status of the second block based on an operation state of the dedicated test block, and to update both the dedicated test block and the second block based on the status of the second block.

17 Claims, 12 Drawing Sheets

(56) References Cited

U.S. PATENT DOCUMENTS

| | | | |
|---|---|---|---|
| 2013/0318394 A1* | 11/2013 | Wu .................... | G06F 11/1417 |
| | | | 714/15 |
| 2014/0173234 A1* | 6/2014 | Jung .................... | G06F 3/0616 |
| | | | 711/162 |
| 2015/0242202 A1* | 8/2015 | Jun ........................ | G06F 8/654 |
| | | | 717/168 |
| 2016/0055068 A1* | 2/2016 | Jeansonne ............. | G06F 3/0619 |
| | | | 714/15 |
| 2017/0039142 A1* | 2/2017 | Sundararaman ...... | G06F 3/0673 |
| 2017/0147503 A1* | 5/2017 | de Silva ................ | G06F 3/0634 |
| 2019/0243659 A1* | 8/2019 | Lewis ................... | G06F 9/4401 |
| 2019/0286436 A1* | 9/2019 | Liu ....................... | G06F 9/4401 |
| 2020/0012487 A1* | 1/2020 | Lin ........................ | G06F 8/65 |

* cited by examiner

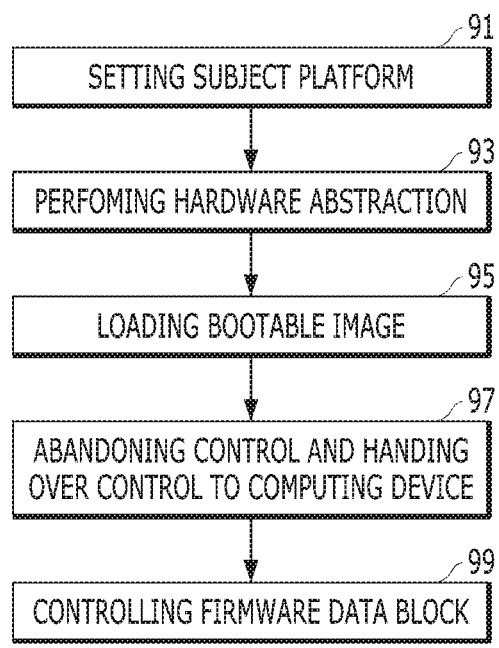
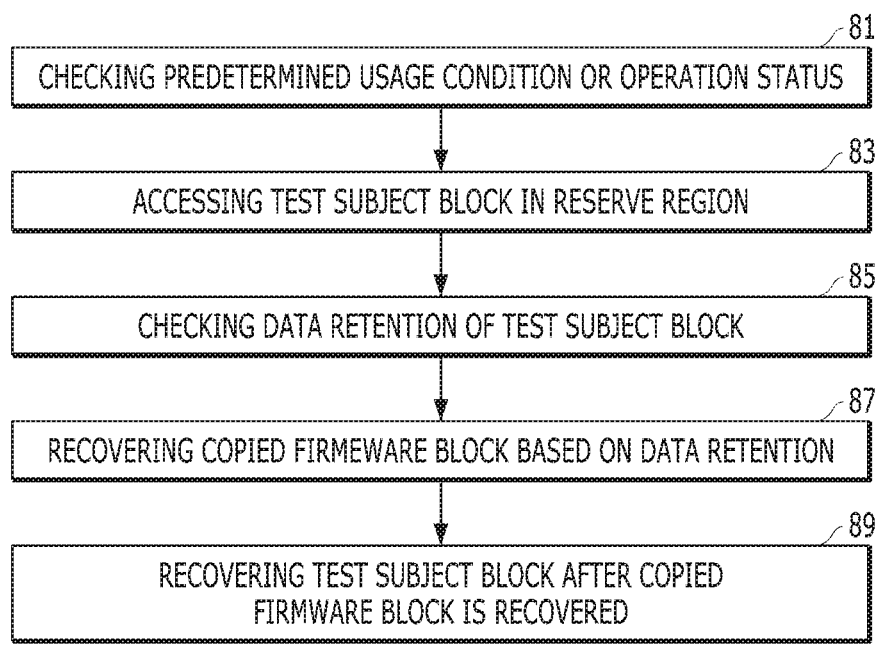

APPARATUS AND METHOD FOR RETAINING FIRMWARE IN MEMORY SYSTEM

CROSS-REFERENCE TO RELATED APPLICATION

This patent application claims priority under 35 U.S.C. § 119(a) to Korean Patent Application No. 10-2018-0110841, filed on Sep. 17, 2018, the entire disclosure of which is incorporated herein by reference.

TECHNICAL FIELD

Various embodiments of the invention relate to a memory system, and more particularly, to an apparatus and a method for maintaining, controlling and managing firmware stored in the memory system.

BACKGROUND

Recently, the computer environment paradigm has shifted to ubiquitous computing, which enables a computer system to be accessed anytime and everywhere. As a result, the use of portable electronic devices such as mobile phones, digital cameras, notebook computers and the like is increasing. Such portable electronic devices typically use or include a memory system that uses or embeds at least one memory device, i.e., a data storage device. The data storage device can be used as a main storage device or an auxiliary storage device of a portable electronic device.

Unlike a hard disk, a data storage device used as a nonvolatile semiconductor memory device is advantageous in that it has excellent stability and durability because it has no mechanical driving part (e.g., a mechanical arm), and has high data access speed and low power consumption. Examples of such a data storage device include a USB (Universal Serial Bus) memory device, a memory card having various interfaces, and a solid state drive (SSD).

BRIEF DESCRIPTION OF THE DRAWINGS

The description herein makes reference to the accompanying drawings wherein like reference numerals refer to like parts throughout the several views, and wherein:

FIG. 10 is a flowchart illustrating an operation executed by firmware in a memory system in accordance with an embodiment of the disclosure;

FIG. 11 is a flowchart illustrating a method for controlling firmware in a memory system.

DETAILED DESCRIPTION

Figure 1:
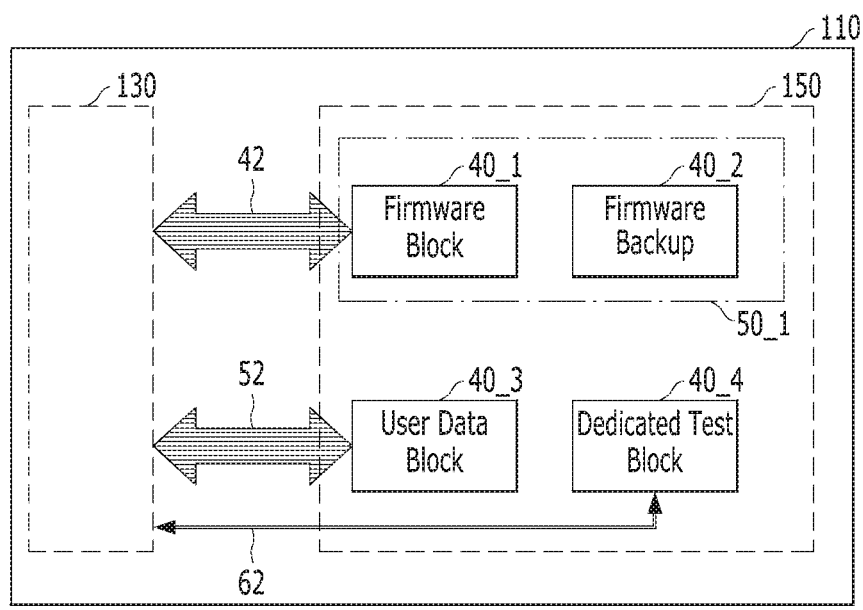
FIG. 1 is a block diagram illustrating an apparatus controlling firmware in a memory system in accordance with an embodiment of the disclosure.

Various examples of the disclosure are described below in more detail with reference to the accompanying drawings. Aspects and features of the present invention, however, may be embodied in different ways to form other embodiments, including variations of any of the disclosed embodiments. Thus, the present invention is not to be construed as being limited to the embodiments set forth herein. Rather, the described embodiments are provided so that this disclosure is thorough and complete and fully conveys the disclosure to those skilled in the art to which this invention pertains. Throughout the disclosure, like reference numerals refer to like parts throughout the various figures and examples of the disclosure. It is noted that reference to "an embodiment," "another embodiment" or the like does not necessarily mean only one embodiment, and different references to any such phrase are not necessarily to the same embodiment(s).

It will be understood that, although the terms "first", "second", "third", and so on may be used herein to identify various elements, these elements are not limited by these terms. These terms are used to distinguish one element from another element that otherwise have the same or similar names. Thus, a first element in one instance could be termed a second or third element in another instance without departing from the spirit and scope of the invention.

The drawings are not necessarily to scale and, in some instances, proportions may have been exaggerated in order to clearly illustrate features of the embodiments. When an element is referred to as being connected or coupled to another element, it should be understood that the former can be directly connected or coupled to the latter, or electrically connected or coupled to the latter via one or more intervening elements therebetween. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the invention. As used herein, singular forms are intended to include the plural forms and vice versa, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the disclosure and the relevant art, and not be interpreted in an idealized or overly formal sense unless expressly so defined herein.

In the following description, numerous specific details are set forth in order to provide a thorough understanding of the invention. The invention may be practiced without some or all of these specific details. In other instances, well-known process structures and/or processes have not been described in detail in order not to unnecessarily obscure the invention.

It is also noted, that in some instances, as would be apparent to those skilled in the relevant art, a feature or element described in connection with one embodiment may be used singly or in combination with other features or elements of another embodiment, unless otherwise specifically indicated.

Embodiments of the disclosure provide a memory system, a data processing system, and an operation process or a method, which can quickly and reliably process data into a memory device by reducing operational complexity and performance degradation of the memory system, thereby enhancing usage efficiency of the memory device.

Embodiments of the disclosure provide a method and an apparatus for overcoming characteristics or properties of non-volatile memory devices, such as read disturb and data retention, in a process of checking firmware status to enhance or improve reliability of firmware stored in a memory device of a memory system.

In addition, when it is determined that the operation environment or operating condition of the memory system is approaching or has reached a certain state where operation reliability may be affected, the firmware status is checked for operations in the memory system and, if necessary, relevant data of the firmware can be copied or moved for avoiding a risk of loss. Embodiments of the present invention provide a method and an apparatus that can avoid errors in the memory system even when an event such as a power-off or a restart occurs.

In an embodiment, a memory system can include a memory device including plural memory blocks divided into a system region, a user data region and a reserved region, wherein the system region includes a first block storing original firmware and a second block storing copied firmware, and the reserved region includes a dedicated test block having an operational characteristic that is substantially the same as that of the second block; and a controller configured to access the dedicated test block for determining a status of the second block based on an operation state of the dedicated test block, and to update both the dedicated test block and the second block based on the status of the second block.

By the way of example but not limitation, the user data region includes plural spaces each being accessible based on a logical address through a map table, and the system region and the reserved region includes other plural spaces each being accessible based on a physical address but not a logical address.

The user data region is capable of storing at least one of an operating system and a piece of user data, which is used by a computing device engaged with the memory system.

The original firmware or the copied firmware can include at least one of program code, an instruction or an engine for supplying an interface between the operating system and at least one hardware component of the memory system, and the original firmware is configured to be executed automatically when power is supplied, and configured to be upgraded according to a specific event.

The original firmware or the copied firmware can include a boot loader configured to pass control of the memory system to a computing device operating the operating system.

The first block, the second block and the dedicated test block can have distinct physical locations in the memory device. When the original firmware in the first block is not executed properly, the controller accesses and executes the copied firmware stored in the second block.

The dedicated test block and the second block have substantially the same erase/write (E/W) cycles or program/erase (P/E) cycles.

The controller is configured to access the dedicated test block, check data retention status of the dedicated test block, and determine retention status of the copied firmware based on the data retention status of the dedicated test block.

When the data detection status of the dedicated test block in the reserved region is outside of a specific range, the controller is configured to copy the copied firmware from the second block to a buffer, erase the second block, and re-program the copied firmware stored in the buffer into the second block.

After the copied firmware is re-programed in the second block, the controller is configured to copy test data stored in the dedicated test block of the reserved region into a buffer, erase the dedicated test block, and re-program the test data to the dedicated test block.

In another embodiment, an apparatus for controlling firmware in a memory system including at least one processor and at least one memory including computer program code. The at least one memory and the computer program code are configured, with the at least one processor, to cause the apparatus to access a dedicated test block located in a reserved region of a memory device, to the dedicated test block having an operational characteristic that is substantially the same as that of a block storing copied firmware in a system region of the memory device, determine a data retention status of the dedicated test block, and recover the block storing the copied firmware based on a result of the determine operation.

In another embodiment, a method for operating a memory system can include accessing a dedicated test block located in a reserved region of a memory device and having an operational characteristic that is substantially the same as that of a block storing copied firmware in a system region of the memory device; determining a data retention status of the dedicated test block; and recovering the block storing the copied firmware based on a result of the determining operation.

The method can further include checking whether an operation status of the memory system meets a set condition.

The method can further include recovering the dedicated test block after recovering the block storing the coped firmware.

The memory device can include plural memory blocks which are divided into a system region, a user data region and a reserved region. The system region includes a block storing original firmware and the block storing the copied firmware, and the reserved region includes the dedicated test bloc.

The user data region includes plural spaces each being accessible based on, a logical address through a map table, and the system region and the reserved region includes other plural spaces each being accessible based on a physical address but not a logical address.

The block storing the original firmware, the block storing the copied firmware and the dedicated test block have distinct physical locations in the memory device. The dedicated test block and the block storing the copied firmware have substantially the same limit in available erase/write(E/W) cycles or program/erase(P/E) cycles.

The determining the data retention status can include determining a retention status of the copied firmware based on the data retention status of the dedicated test block.

The recovering the block storing the copied firmware can include, when the data retention status of the dedicated test block in the reserved region is outside a specific range, copying the copied firmware from the block in the system region to a buffer, erasing the block in the system region, and re-programing the copied firmware stored in the buffer into the block in the system region.

The recovering the dedicated test block can include copying test data stored in the dedicated test block of the reserved region into a buffer, erasing the dedicated test block, and re-programming the test data to the dedicated test block.

In another embodiment, a memory system can include a memory device configured to store firmware for the memory system, a copy of the firmware and selective data; and a controller configured to: boot the memory system by executing the copy of the firmware when execution of the firmware fails; and recover the copy of the firmware when the selective data becomes defective. The copy of the firmware and the selective data are stored in different memory blocks having substantially the same operating characteristics. None of the memory blocks storing the copy of the firmware and the selective data is accessible by a logical address.

Embodiments of the disclosure are described in detail below with reference to the accompanying drawings, wherein like numbers reference like elements.

In FIG. 1, a memory system 10, in accordance with an embodiment of the disclosure, includes a controller 130 and a memory device 150. The memory system 110 may be engaged with another device, e.g., a computing device.

Referring to FIG. 1, the controller 130 may include at least one processor and at least one memory. The memory device 150 coupled to the controller 130 via at least one data path may include a plurality of unit memory cells, each capable of storing data of at least one bit.

For example, the memory device 150 may be a nonvolatile memory including at least one die and may include a plurality of blocks including a plurality of memory cells.

The blocks of the memory device 150 may include a firmware block 40_1, a firmware backup block 40_2, a user data block 40_3 and a dedicated test block 40_4, sometimes referred to simply as test block 40_4. The firmware block 40_1 may store firmware including commands, programs, engines and the like to support basic (or fundamental) operations of the memory system 110. The firmware stored in the firmware block 40_1 may be responsible for setting up the memory system initially. For example, the firmware may perform functions such as internal operation control, initialization, self-diagnosis and the like of the memory system 110.

In particular, the firmware may function as low-level software for providing an interface between hardware configuration of the memory system 110 and application-level software or an operating system of a computing device engaged with the memory system 110. The firmware stored in a set location of the memory device 150 such as the firmware block 40_1 may be transferred to the controller 130 when power is supplied to the memory system 110. The controller 130 can use the firmware to perform the basic operations. The firmware may be executable even if the memory system 110 is initialized. That is, the firmware block 40_1 is fixed at a set position in the memory device 150. When the power is supplied, the firmware block 40_1 is accessed according to a request or a command issued by the controller 130.

In accordance with an embodiment, the firmware may include a boot loader. The boot loader may function as a program or a command that performs the role of transferring the control of the memory system 110 to another device such as the computing device engaged with the memory system 110, when an operating system or an application program is loaded and executed in the other device.

The firmware above described is for supporting the basic operations in the memory system 110. The original firmware is stored in the firmware block 40_1. But, when the firmware is abnormal due to any of various reasons, the memory system 110 may be difficult to operate normally. To avoid such a case, the memory device 150 may include the firmware backup block 40_2 that stores a copy of the firmware and is accessed when the original firmware is not working properly. In an embodiment, the memory device 150 includes plural firmware backup blocks 40_2.

The firmware backup block 40_2 may be designated or fixed in the memory device 150 in the same manner as the firmware block 40_1. At least one firmware backup block 40_2 may store a copy of the firmware stored in the firmware block 40_1. In accordance with an embodiment, when there are plural firmware backup blocks 40_2, one such block may store a current version of firmware, i.e., a copy of the firmware stored in firmware block 40_1 and another firmware backup block 40_2 may store a previous version of the firmware. Thus, different versions of the firmware can be stored in different blocks of the plural firmware backup blocks 40_2, respectively.

The firmware block 40_1 and the firmware backup block 40_2 in the memory device 150 may be located in a system area 50_1. Different areas of the memory device 150 are described below with reference to FIG. 6. The controller 130 should control or manage the copied firmware stored in the firmware backup block 40_2 in the event that the original firmware malfunctions or otherwise does not work properly.

The plurality of blocks in the memory device 150 may be subject to various characteristics that arise due to the construction and operation of a nonvolatile memory device. One such characteristic is read disturb. The read disturb includes a phenomenon in which peripheral unit memory cells are affected in the process of reading at least one unit memory cell in a block. When unit memory cells of a block are arranged in a matrix form and plural pieces of data are outputted from unit memory cells in a specific row corresponding to a word line, the distribution of threshold voltage corresponding to data stored in the peripheral unit memory cells may be changed by a voltage and a current applied into the unit memory cells in the specific row. The read disturb can occur in the firmware block 40_1 as well as in the firmware backup block 40_2. Whenever the copied firmware is accessed by a test read accessing the firmware backup block 40_2 to check whether the copied firmware stored in the firmware backup block 40_2 is normal or safe, the read disturb can affect the copied firmware, which is a type of data stored in the nonvolatile memory cells. Given the nature of the read disturb, it may be more effective for the controller 130 not to access the firmware backup block 40_2 to keep the copied firmware safe and able to operate normally.

Another characteristic of the nonvolatile memory cells in the plurality of blocks of the memory device 150 is that data retention may not be permanent. The plural pieces of data stored in the unit memory cells can gradually disappear or be erased over time. For example, a piece of data stored in the unit memory cell of the nonvolatile memory device may cause a change of threshold voltage in a gate structure. According to the piece of data, the controller can confine some charges in a specific layer in the gate structure. It is possible to ascertain the value of the piece of data stored in the unit memory cell. As time passes in a natural state, however, the threshold voltage range may become more diffused because changes may move or go back to equilibrium condition, and later, it may become difficult to specify a range of the threshold voltage in the unit memory cell. In this case, the unit memory cell may lose data when the controller cannot identify an original range of the threshold voltage. The data retention of a unit memory cell, which is related to the performance of the memory device, may be characterized as a retention time. As described above, when the controller 130 does not access the firmware backup block 40_2 within the retention time in consideration of the characteristics of the read disturb, the copied firmware in the firmware backup block 40_2 may be lost.

Randomly or periodically accessing the firmware backup block 40_2 to verify or check whether the copied firmware stored therein is normal might be not good in consideration of the read disturb in the memory device. Reading data stored in a specific location can cause read disturb around the specific location in the memory device 150. On the other hand, read or access to the firmware backup block 40_2 may be required in consideration of data retention of the firmware backup block 40_2. As one of examples for addressing above-described issues or risks, the memory device 150 may include the test block 40_4.

The test block 40_4 included in the memory device 150 may be physically distinguished from the firmware block 40_1, the firmware backup block 40_2 and the user data block 40_3. The test block 40_4 is used only to determine status of the firmware backup block 40_2. The test block 40_4 may not be used for other purposes. The test block 40_4 may include any data that is identifiable by the controller 130. In accordance with an embodiment, the test block 40_4 may include the same data as the firmware backup block 40_2. In another example, the test block 40_4 can store specific code or useless data if identifiable.

The test block 40_4 may have substantially the same properties as the firmware backup block 40_2 in terms of lifespan and health. The unit memory cell of the nonvolatile memory device has a fixed lifetime. Whenever a piece of data is written to the unit memory cell and the written data is erased, the unit memory cell may be slightly damaged. Repeated program and erase operations performed on a specific unit memory cell can cause it harm. The operation of writing data in the nonvolatile memory is performed page by page, but the operation of erasing or deleting data is performed block by block. Therefore, based on numbers of erase/write (E/W) cycles or program/erase (P/E) cycles, the life time or health status can be estimated in a unit of block in the nonvolatile memory device. In accordance with an embodiment, the dedicated test block 40_4 and the firmware backup block 40_2 may be configured to allow substantially the same numbers of erase/write (E/W) cycles or program/delete (P/E) cycles. That is, the dedicated test block 40_4 may have an operational characteristic that is substantially the same as that of the firmware backup block 40_2.

During an initial setting/operation of the memory system 110, the controller can find a specific block having a substantially the same number of erase/write (E/W) cycles or program/erase (P/E) cycles as that of the firmware backup block 40_2. The controller can determine such specific block as the dedicated test block 40_4. The firmware backup block 40_2 and the dedicated test block 40_4 can be recovered together later so that the firmware backup block 40_2 and the dedicated test block 40_4 can have substantially the same operational status. For example, when the firmware backup block 40_2 and the dedicated test block 40_4 are determined in this way at this initial setting, later when they are recovered together, the firmware backup block 40_2 and the dedicated test block 40_4 will be in substantially the same condition in terms of erase/write (E/W) cycles or program/erase (p/E) cycles performed.

In accordance with an embodiment, the firmware block 40_1, the firmware backup block 40_2, and the dedicated test block 40_4 may be fixed within the memory device 150 at designated positions. For example, during the use of the memory system 110, physical block addresses of the firmware block 40_1, the firmware backup block 40_2 and the test dedicated block 40_4 may not be changed.

When power is supplied to the memory system 110, the controller 130 may access the firmware block 40_1 to load the firmware (double-sided arrow 42). After loading the firmware (42), the controller 130 may access the user data block 40_3 (double-sided arrow 52), in order to deliver an operating system (OS), etc., which is stored in the memory system 110, into a computing device associated with the memory system 110. In addition, the controller 130 may access the test block 40_4 to manage the copied firmware in the firmware backup block 40_2 (double-sided arrow 62), e.g., estimating (or indirectly checking) status of the firmware backup block 40_2. The above-described operation is described in more detail below.

Figure 2:
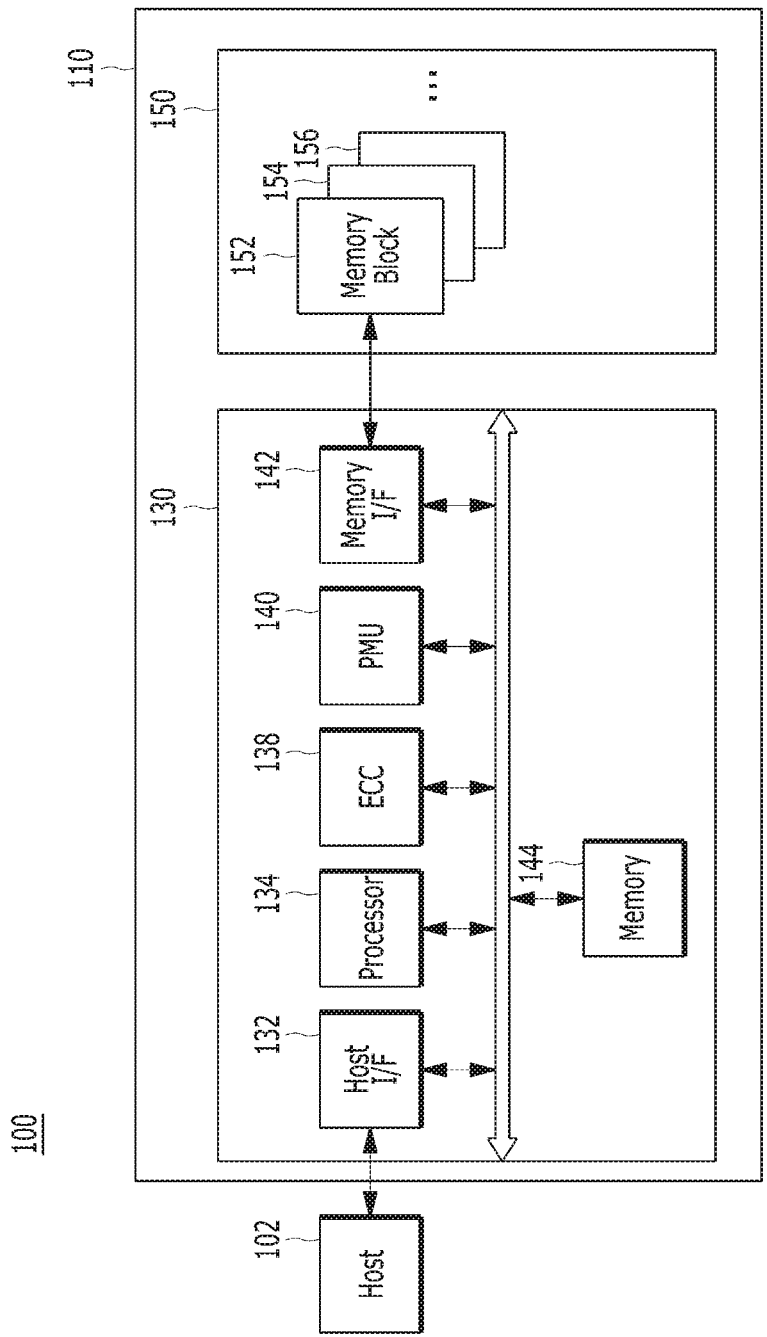
FIG. 2 is a block diagram illustrating a data processing system including a memory system in accordance with an embodiment of the disclosure.

In FIG. 2, a data processing system 100 in accordance with an embodiment of the disclosure may include a host 102 engaged or operably coupled with a memory system 110.

The host 102 may include, for example, any of a variety of portable electronic devices, such as a mobile phone, an MP3 player and a laptop computer, or an electronic device such as a desktop computer, a game player, a television (TV), a projector and the like.

The host 102 also includes at least one operating system (OS), which can generally manage, and control, functions and operations performed in the host 102. The OS can provide interoperability between the host 102 engaged with the memory system 110 and the user of the memory system 110. The OS may support functions and operations corresponding to user's requests. By way of example but not limitation, the OS may include a general operating system and a mobile operating system according to mobility of the host 102. The general operating system may be split into a personal operating system and an enterprise operating system according to system requirements or user's environment. The personal operating system, including Windows and Chrome, may be subject to support services for general purposes. But the enterprise operating systems can be specialized for securing and supporting high performance, including Windows servers, Linux, Unix and the like. Further, the mobile operating system may include an Android, an iOS, a Windows mobile and the like. The mobile operating system may be subject to support services or functions for mobility (e.g., a power saving function). The host 102 may include a plurality of operating systems. The host 102 may execute multiple operating systems interlocked with the memory system 110, corresponding to a user's request. The host 102 may transmit a plurality of commands corresponding to the user's requests into the memory system 110, thereby performing operations corresponding to commands within the memory system 110. Handling plural commands in the memory system 110 is described below with reference to FIGS. 4 and 5.

The memory system 110 may operate or perform a specific function or operation in response to a request from the host 102 and, particularly, may store data to be accessed by the host 102. The memory system 110 may be used as a main memory system or an auxiliary memory system of the host 102. The memory system 110 may be implemented with any one of various types of storage devices, which may be electrically coupled with the host 102, according to a protocol of a host interface. Non-limiting examples of suitable storage devices include a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card, a memory stick, and the like.

The storage devices for the memory system 110 may be implemented with a volatile memory device, for example, a dynamic random access memory (DRAM) and a static RAM (SRAM), and/or a nonvolatile memory device such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM or ReRAM) and a flash memory.

The memory system 110 may include a controller 130 and a memory device 150. The memory device 150 may store data to be accessed by the host 102. The controller 130 may control storage of data in the memory device 150.

The controller 130 and the memory device 150 may be integrated into a single semiconductor device, which may be included in any of the various types of memory systems as exemplified above.

By way of example but not limitation, the controller 130 and the memory device 150 may be integrated into a single semiconductor device. The controller 130 and memory device 150 may be so integrated to form an SSD for improving operation speed. When the memory system 110 is used as an SSD, the operating speed of the host 102 connected to the memory system 110 can be improved more than that of the host 102 connected with a hard disk. In another embodiment, the controller 130 and the memory device 150 may be integrated into one semiconductor device to form a memory card, such as a PC card (PCMCIA), a compact flash card (CF), a smart media card (SM, SMC), a memory stick, a multimedia card (MMC, RS-MMC, MMC-micro), a SD card (SD, miniSD, microSD, SDHC), or a universal flash memory.

The memory system 110 may be configured as a part of, for example, a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation system, a black box, a digital camera, a digital multimedia broadcasting (DMB) player, a 3-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, a radio frequency identification (RFID) device, or one of various components configuring a computing system.

The memory device 150 may be a nonvolatile memory device and may retain data stored therein even while an electrical power is not supplied. The memory device 150 may store data provided from the host 102 through a write operation, while providing data stored therein to the host 102 through a read operation. The memory device 150 may include a plurality of memory blocks 152, 154, 156, each of which may include a plurality of pages. Each of the plurality of pages may include a plurality of memory cells to which a plurality of word lines (WL) are electrically coupled. The memory device 150 also includes a plurality of memory dies, each of which includes a plurality of planes, each of which includes memory blocks, among the plurality of memory blocks 152, 154, 156. In addition, the memory device 150 may be a non-volatile memory device, for example a flash memory, wherein the flash memory may be a three-dimensional stack structure.

The controller 130 may control overall operations of the memory device 150, such as read, write, program and erase operations. For example, the controller 130 may control the memory device 150 in response to a request from the host 102. The controller 130 may provide the data, read from the memory device 150, with the host 102. The controller 130 may store the data, provided by the host 102, into the memory device 150.

The controller 130 may include a host interface (I/F) 132, a processor 134, an error correction code (ECC) unit 138, a power management unit (PMU) 140, a memory interface (I/F) 142 and a memory 144, all operatively coupled via an internal bus.

The host interface 132 may process commands and data provided from the host 102, and may communicate with the host 102 through at least one of various interface protocols, such as universal serial bus (USB), multimedia card (MMC), peripheral component interconnect-express (PCI-e or PCIe), small computer system interface (SCSI), serial-attached SCSI (SAS), serial advanced technology attachment (SATA), parallel advanced technology attachment (PATA), small computer system interface (SCSI), enhanced small disk interface (ESDI) and integrated drive electronics (IDE). In accordance with an embodiment, the host interface 132 is a component for exchanging data with the host 102, which may be implemented through firmware called a host interface layer (HIL).

The ECC unit 138 can correct error bits of the data to be processed in (e.g., outputted from) the memory device 150, which may include an ECC encoder and an ECC decoder. Here, the ECC encoder can perform error correction encoding of data to be programmed in the memory device 150 to generate encoded data into which a parity bit is added and store the encoded data in memory device 150. The ECC decoder can detect and correct errors contained in a data read from the memory device 150 when the controller 130 reads the data stored in the memory device 150. In other words, after performing error correction decoding on the data read from the memory device 150, the ECC unit 138 can determine whether the error correction decoding has succeeded and output an instruction signal (e.g., a correction success signal or a correction fail signal). The ECC unit 138 can use the parity bit which is generated during the ECC encoding process, for correcting the error bit of the read data. When the number of the error bits is greater than or equal to a threshold number of correctable error bits, the ECC unit 138 may not correct error bits but instead may output an error correction fail signal indicating failure in correcting the error bits.

The ECC unit 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and so on. The ECC unit 138 may include all or some of circuits, modules, systems or devices for performing the error correction operation based on at least one of the above described codes.

The PMU 140 may manage an electrical power provided in the controller 130.

The memory interface 142 may serve as an interface for handling commands and data transferred between the controller 130 and the memory device 150, to allow the controller 130 to control the memory device 150 in response to a request delivered from the host 102. The memory interface 142 may generate a control signal for the memory device 150 and may process data entered into or outputted from the memory device 150 under the control of the processor 134 in a case when the memory device 150 is a flash memory and, in particular, when the memory device 150 is a NAND flash memory. The memory interface 142 can provide an interface for handling commands and data between the controller 130 and the memory device 150, for example, operations of NAND flash interface, in particular, operations between the controller 130 and the memory device 150. In accordance with an embodiment, the memory interface 142 can be implemented through firmware called a Flash Interface Layer (FIL) as a component for exchanging data with the memory device 150.

The memory 144 may support operations performed by the memory system 110 and the controller 130. The memory 144 may store temporary or transactional data generated or delivered for operations in the memory system 110 and the controller 130. The controller 130 may control the memory device 150 in response to a request from the host 102. The controller 130 may deliver data read from the memory device 150 into the host 102. The controller 130 may store data entered through the host 102 within the memory device 150. The memory 144 may be used to store data required for the controller 130 and the memory device 150 to perform operations such as read operations or program/write operations.

The memory 144 may be implemented with a volatile memory. The memory 144 may be implemented with a static random access memory (SRAM), a dynamic random access memory (DRAM) or both. Although FIG. 1 exemplifies the second memory 144 disposed within the controller 130, the present invention is not limited to that arrangement. That is, the memory 144 may be within or externally to the controller 130. For instance, the memory 144 may be embodied by an external volatile memory having a memory interface transferring data and/or signals between the memory 144 and the controller 130.

The memory 144 can store data necessary for performing operations such as data writing and data reading requested by the host 102 and/or data transfer between the memory device 150 and the controller 130 for background operations such as garbage collection and wear levelling as described above. In accordance with an embodiment, for supporting operations in the memory system 110, the memory 144 may include a program memory, a data memory, a write buffer/cache, a read buffer/cache, a data buffer/cache, a map buffer/cache, and the like.

The processor 134 may be implemented with a microprocessor or a central processing unit (CPU). The memory system 110 may include one or more processors 134. The processor 134 may control the overall operations of the memory system 110. By way of example but not limitation, the processor 134 can control a program operation or a read operation of the memory device 150, in response to a write request or a read request entered from the host 102. In accordance with an embodiment, the processor 134 may use or execute firmware to control the overall operations of the memory system 110. Herein, the firmware may be referred to as a flash translation layer (FTL). The FTL may serve as an interface between the host 102 and the memory device 150. The host 102 may transmit requests for write and read operations to the memory device 150 through the FTL.

The FTL may manage operations of address mapping, garbage collection, wear-leveling and so forth. Particularly, the FTL may load, generate, update, or store map data. Therefore, the controller 130 may map a logical address, which is entered from the host 102, with a physical address of the memory device 150 through the map data. The memory device 150 may otherwise function as a general storage device to perform a read or write operation because of the address mapping operation. Also, through the address mapping operation based on the map data, when the controller 130 tries to update data stored in a particular page, the controller 130 may program the updated data on another empty page and may invalidate old data of the particular page (e.g., update a physical address, corresponding to a logical address of the updated data, from the particular page to the newly programed page) due to a characteristic of a flash memory device. Further, the controller 130 may store map data of the new data into the FTL.

For example, when performing an operation requested from the host 102 in the memory device 150, the controller 130 uses the processor 134 implemented as a microprocessor or central processing unit (CPU) or the like. The processor 134 engaged with the memory device 150 can handle instructions or commands corresponding to an inputted command from the host 102. The controller 130 can perform a foreground operation as a command operation, corresponding to an command inputted from the host 102, such as a program operation corresponding to a write command, a read operation corresponding to a read command, an erase/discard operation corresponding to an erase/discard command and a parameter set operation corresponding to a set parameter command or a set feature command with a set command.

For another example, the controller 130 may perform a background operation on the memory device 150 through the processor 134. By way of example but not limitation, the background operation for the memory device 150 includes an operation of copying and storing data in a memory block, among the memory blocks 152, 154, 156 in the memory device 150, to another memory block (e.g., a garbage collection (GC) operation). The background operation can include an operation to move or swap data stored in at least one of the memory blocks 152, 154, 156 in a memory device 150, into at least another of the memory blocks 152, 154, 156 (e.g., a wear leveling (WL) operation). During a background operation, the controller 130 may use the processor 134 for storing the map data stored in the controller 130 to at least one of the memory blocks 152, 154, 156, e.g., a map flush operation. A bad block management operation of checking for bad blocks among the plurality of memory blocks 152, 154, 156 is another example of a background operation performed by the processor 134.

In accordance with an embodiment, the operation information confirmation circuitry 124 shown in FIG. 1 may be implemented through at least one processor 134 and at least one memory 144 in the controller 130 described in FIG. 2.

In the memory system 110, the controller 130 performs a plurality of command operations corresponding to a plurality of commands received from the host 102. For example, when performing a plurality of program operations corresponding to plural program commands, a plurality of read operations corresponding to plural read commands and a plurality of erase operations corresponding to plural erase commands sequentially, randomly or alternatively, the controller 130 can determine which channel(s) or way(s) for connecting the controller 130 to which memory die(s) in the memory 150 is/are proper or appropriate for performing each operation. The controller 130 can send or transmit data or instructions via determined the channel(s) or way(s) for performing each operation. The plurality of memory dies can transmit an operation result via the same channel(s) or way(s), respectively, after each operation is complete. Then, the controller 130 may transmit a response or an acknowledge signal to the host 102. In an embodiment, the controller 130 can check a status of each channel or each way. In response to a command received from the host 102, the controller 130 may select at least one channel or way based on the status of each channel or each way so that instructions and/or operation results with data may be delivered via selected channel(s) or way(s).

By way of example but not limitation, the controller 130 can recognize statuses regarding channels (or ways) associated with memory dies in the memory device 150. The controller 130 may determine each channel or each way as being in a busy state, a ready state, an active state, an idle state, a normal state, or an abnormal state. The controller's determination of which channel or way an instruction (and/or a data) is delivered through can be based on a physical block address, e.g., to which die(s) the instruction (and/or the data) is delivered. The controller 130 can refer to descriptors delivered from the memory device 150. The descriptors can include a block or page of parameters that describe informative items about the memory device 150, which is a data with a set format or structure. For instance, the descriptors may include device descriptors, configuration descriptors, unit descriptors, and the like. The controller 130 can refer to, or use, the descriptors to determine with which channel(s) or way(s) an instruction or a data is exchanged.

A management unit (not shown) may be included in the processor 134. The management unit may perform bad block management of the memory device 150. The management unit may find bad memory blocks, which are in unsatisfactory condition for further use, as well as perform bad block management on the bad memory blocks. When the memory device 150 is a flash memory, for example, a NAND flash memory, a program failure may occur during the write operation, for example, during the program operation, due to characteristics of a NAND logic function. During the bad block management, the data of the program-failed memory block or the bad memory block may be programmed into a new memory block. The bad blocks may seriously aggravate the utilization efficiency of the memory device 150 having a 3D stack structure and the reliability of the memory system 110. Thus, reliable bad block management may enhance or improve performance of the memory system 110.

Figure 3:
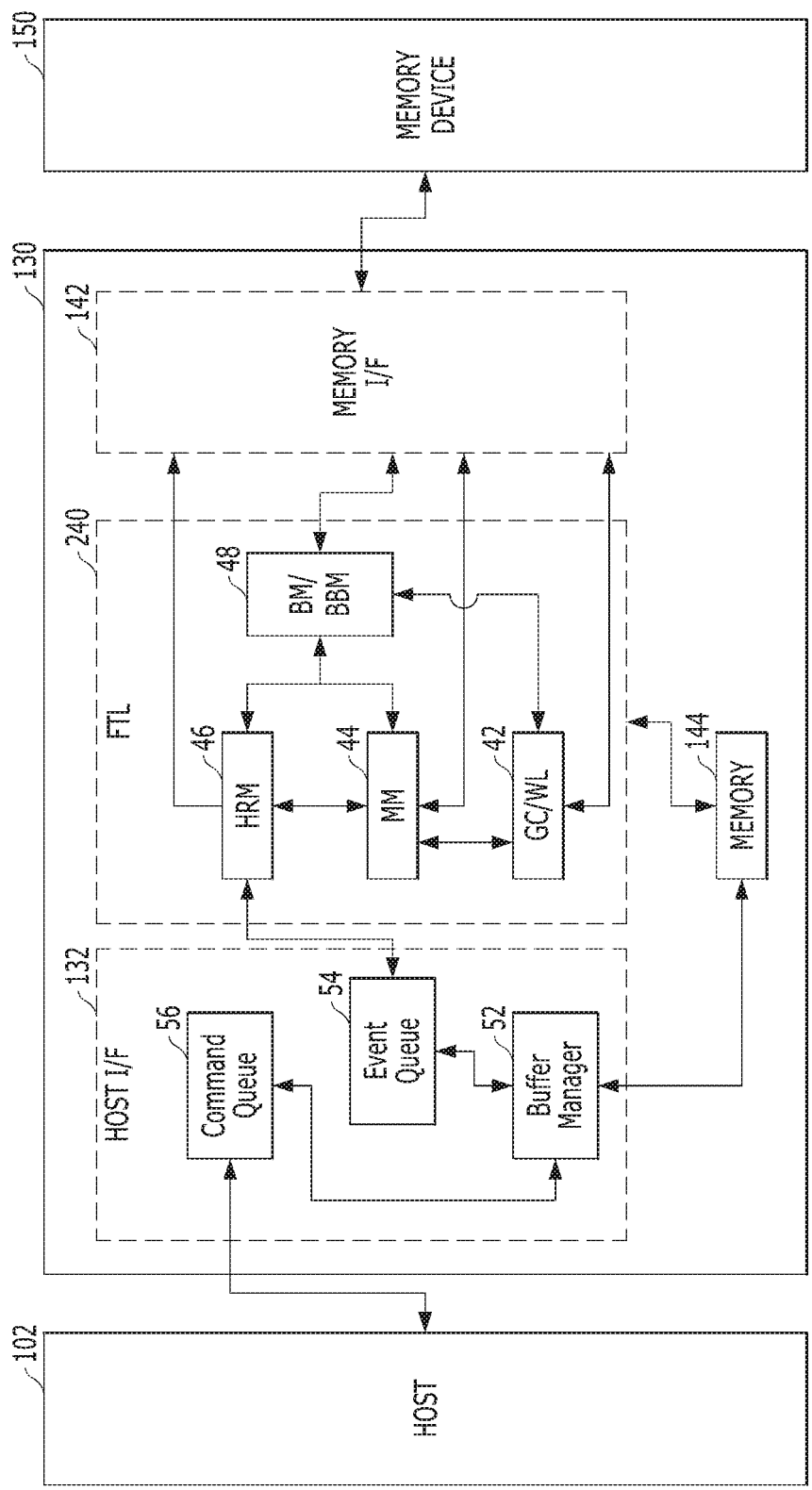
FIG. 3 is a block diagram illustrating a memory system in accordance with an embodiment of the disclosure.

Referring to FIG. 3, a controller in a memory system in accordance with another example of the disclosure is described in detail. The controller 130 cooperates with the host 102 and the memory device 150. The controller 130 can include a host interface 132, a flash translation layer (FTL) unit 240, a memory interface 142 and a memory 144.

Although not shown in FIG. 3, in accordance with an embodiment, the ECC unit 138 described in FIG. 2 may be included in the flash translation layer (FTL) unit 240. In another embodiment, the ECC unit 138 may be implemented as a separate module, a circuit, firmware or the like, which is included in, or associated with, the controller 130.

The host interface 132 is for handling commands, data, and the like transmitted from the host 102. By way of example but not limitation, the host interface 132 can include a command queue 56, a buffer manager 52 and an event queue 54. The command queue 56 can sequentially store commands, data, and the like transmitted from the host 102 and output them to the buffer manager 52 in a stored order. The buffer manager 52 can classify, manage or adjust the commands, the data, and the like, which are delivered from the command queue 56. The event queue 54 can sequentially transmit events for processing the commands, the data, and the like transmitted from the buffer manager 52.

A plurality of commands or data of the same characteristic may be continuously transmitted from the host 102, or commands and data of different characteristics may be transmitted to the memory system 110 after being mixed or jumbled. For example, a plurality of commands for reading data (read commands) may be delivered, or commands for reading data (read command) and programming/writing data (write command) may be alternately transmitted to the memory system 110. The host interface 132 can store commands, data, and the like, which are transmitted from the host 102, to the command queue 56 sequentially. Thereafter, the host interface 132 can estimate or predict what kind of internal operation the controller 130 will perform according to the characteristics of the command, data, etc., which is transmitted from the host 102. The host interface 132 can determine a processing order and a priority of commands, data and the like, based at least on their characteristics. According to characteristics of commands, data, and the like transmitted from the host 102, the buffer manager 52 in the host interface 132 is configured to determine whether the buffer manager should store commands, data, and the like in the memory 144, or whether the buffer manager should deliver the commands, the data, and the like into the flash translation layer (FTL) unit 240. The event queue 54 receives events, entered from the buffer manager 52, which are to be internally executed and processed by the memory system 10 or the controller 130 in response to the commands, the data, etc. transmitted from the host 102, so as to deliver the events into the flash translation layer (FTL) unit 240 in the order received.

In accordance with an embodiment, the host interface 132 described in FIG. 3 may perform the functions of the controller 130 described in FIG. 1. The host interface 132 may set the first memory 104 in the host 102 as a slave and add the first memory 104 as an additional storage space which is controllable or usable by the controller 130.

In accordance with an embodiment, the flash translation layer (FTL) unit 240 can include a host request manager (FIRM) 46, a map manager (MM) 44, a state manager 42 and a block manager 48. The host request manager (HRM) 46 can manage the events entered from the event queue 54. The map manager (MM) 44 can handle or control a map data. The state manager 42 can perform garbage collection or wear leveling. The block manager 48 can execute commands or instructions onto a block in the memory device 150.

By way of example but not limitation, the host request manager (HRM) 46 can use the map manager (MM) 44 and the block manager 48 to handle or process requests according to the read and program commands, and events which are delivered from the host interface 132. The host request manager (HRM) 46 can send an inquiry request to the map data manager (MM) 44, to determine a physical address corresponding to the logical address which is entered with the events. The host request manager (HRM) 46 can send a read request with the physical address to the memory interface 142, to process the read request (handle the events). On the other hand, the host request manager (HRM) 46 can send a program request (write request) to the block manager 48, to program entered data to an empty page (having no data) in the memory device 150, and then, can transmit a map update request corresponding to the program request to the map manager (MM) 44, to update an item relevant to the programmed data in information of mapping the logical-physical addresses to each other.

Here, the block manager 48 can convert a program request delivered from the host request manager (HRM) 46, the map data manager (MM) 44, and/or the state manager 42 into a flash program request used for the memory device 150, to manage flash blocks in the memory device 150. In order to maximize or enhance program or write performance of the memory system 110 (see FIG. 2), the block manager 48 may collect program requests and send flash program requests for multiple-plane and one-shot program operations to the memory interface 142. The block manager 48 may send several flash program requests to the memory interface 142 to enhance or maximize parallel processing of the multi-channel and multi-directional flash controller.

On the other hand, the block manager 48 can be configured to manage blocks in the memory device 150 according to the number of valid pages, select and erase blocks having no valid pages when a free block is needed, and select a block including the least number of valid pages when it is determined that garbage collection is necessary. The state manager 42 can perform garbage collection to move the valid data to an empty block and erase remaining data in the blocks from which the valid data was moved so that the block manager 48 may have enough free blocks (empty blocks with no data). If the block manager 48 provides information regarding a block to be erased to the state manager 42, the state manager 42 is able to check all flash pages of the block to be erased to determine whether each page is valid. For example, to determine validity of each page, the state manager 42 can identify a logical address recorded in an out-of-band (OOB) area of each page. To determine whether each page is valid, the state manager 42 can compare the physical address of the page with the physical address mapped to the logical address obtained from the request. The state manager 42 sends a program request to the block manager 48 for each valid page. A mapping table can be updated through the update of the map manager 44 when the program operation is complete.

The map manager 44 can manage a logical-physical mapping table. The map manager 44 can process requests such as queries, updates, and the like, which are generated by the host request manager (HRM) 46 or the state manager 42. The map manager 44 may store the entire mapping table in the memory device 150 (e.g., a flash/non-volatile memory) and cache mapping entries according to the storage capacity of the memory 144. When a map cache miss occurs while processing inquiry or update requests, the map manager 44 may send a read request to the memory interface 142 to load a relevant mapping table stored in the memory device 150. When the number of dirty cache blocks in the map manager 44 exceeds a certain threshold, a program request can be sent to the block manager 48 so that a clean cache block is made and the dirty map table may be stored in the memory device 150.

On the other hand, when garbage collection is performed, the state manager 42 copies valid page(s) into a free block, and the host request manager (HRM) 46 can program the latest version of the data for the same logical address of the page and currently issue an update request. When the status manager 42 requests the map update in a state in which copying of valid page(s) has not been completed, the map manager 44 may not perform the mapping table update. This is because the map request is issued with old physical information if the status manger 42 requests a map update and a valid page copy is not completed until later. The map manager 44 may perform a map update operation to ensure accuracy only if the latest map table still points to the old physical address.

In accordance with an embodiment, at least one of the state manager 42, the map manager 44 or the block manager 48 can include the operation information confirmation circuitry 124 shown in FIG. 1.

The memory device 150 can include a plurality of memory blocks. The plurality of memory blocks can be different types of memory blocks, such as a single level cell (SLC) memory block or a multi level cell (MLC) Cell) memory block, according to the number of bits that can be stored or represented in one memory cell of such block. Here, the SLC memory block includes a plurality of pages implemented by memory cells, each storing one bit of data. The SLC memory block can have high data I/O operation performance and high durability. The MLC memory block includes a plurality of pages implemented by memory cells, each storing multi-bit data (e.g., two bits or more). The MLC memory block can have a larger storage capacity for the same space compared to the SLC memory block. The MLC memory block can be highly integrated in terms of storage capacity. In an embodiment, the memory device 150 may be implemented with MLC memory blocks, such as a double level cell memory block, a triple level cell (TLC) memory block, a quadruple level cell (QLC) memory block and a combination thereof. The double level memory block may include a plurality of pages implemented by memory cells, each capable of storing 2-bit data. The triple level cell (TLC) memory block can include a plurality of pages implemented by memory cells, each capable of storing 3-bit data. The quadruple level cell (QLC) memory block can include a plurality of pages implemented by memory cells, each capable of storing 4-bit data. In another embodiment, the memory device 150 can be implemented with a block including a plurality of pages implemented by memory cells, each capable of storing 5-bit or more bit data.

In an embodiment of the disclosure, the memory device 150 is embodied as a nonvolatile memory such as a flash memory such as a NAND flash memory, a NOR flash memory and the like. In another embodiment, the memory device 150 may be implemented by at least one of a phase change random access memory (PCRAM), a ferroelectrics random access memory (FRAM), a spin injection magnetic memory (STT-MRAM), and a spin transfer torque magnetic random access memory (STT-MRAM), or the like.

Figure 4:
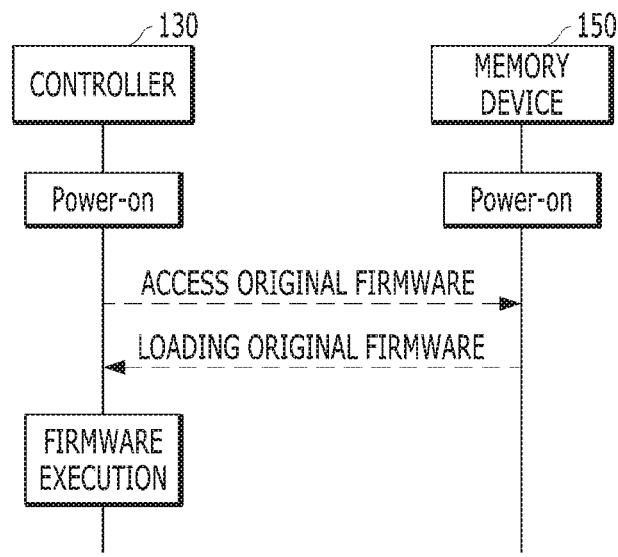
FIG. 4 is a diagram illustrating a first example of initial operations in a memory system.

FIG. 4 illustrates a first example of an initial setting/operation in the memory system.

Referring to FIG. 4, the initial setting/operation in the memory system may be initiated from powering on the memory system 110, i.e., the controller 130 and the memory device 150.

After power is supplied into the memory system, the controller 130 can access a specific block (e.g., the firmware block 40_1) in which the original firmware in the memory device 150 is stored. In an embodiment, the controller 130 may store access information regarding the firmware block 40_1. Since the physical location of the firmware block 40_1 is fixed, the controller 130 can access the firmware block 40_1 according to the access information. In response to controller's request, the memory device 150 can send the firmware stored in the firmware block 40_1 to the controller 130. When the controller 130 executes the firmware, the memory system 110 is able to perform the basic operations such as handling a command entered from the computing device or the host 102 (shown in FIGS. 2 and 3).

Figure 5:
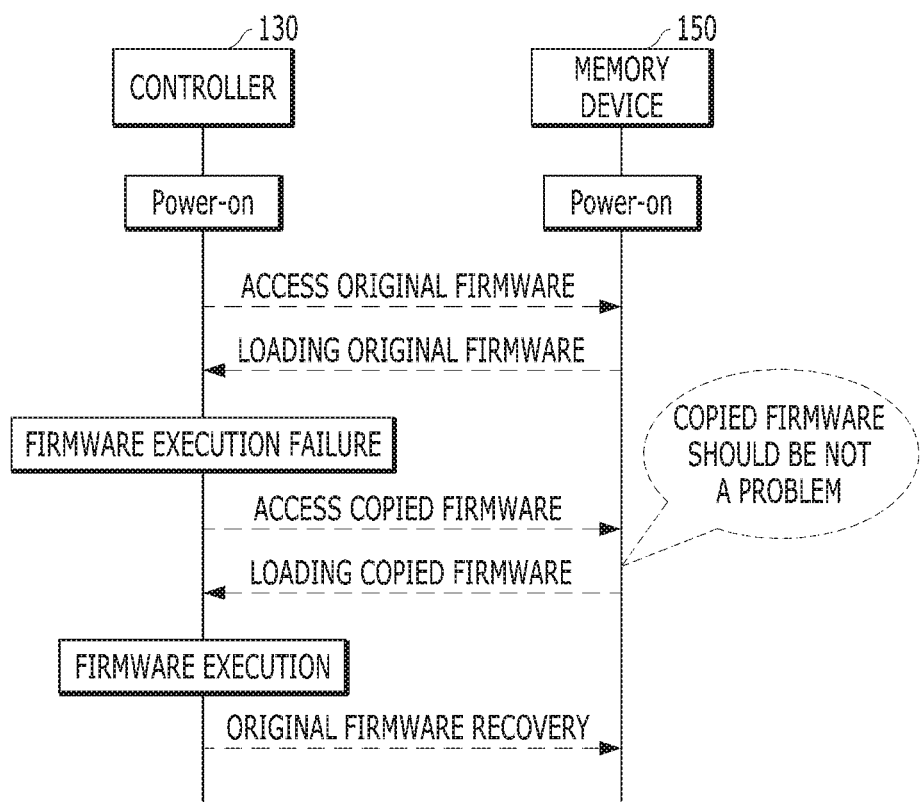
FIG. 5 a diagram illustrating a second example of initial operations in a memory system.

In FIG. 5, a second example of the initial setting/operation in the memory system is described. Referring to FIG. 5, when power is supplied to the memory system, the controller 130 can access a firmware block storing the original firmware, e.g., firmware block 40_1, in the memory device 150, and the memory device 150 can transfer the original firmware to the controller 130, which are similar to operations described in FIG. 4.

When the controller 130 loads firmware sent from the firmware block but fails to execute the firmware, the memory system is not put into a state capable of performing basic operations. In this case, the controller 130 can access another block (e.g., the firmware backup block 40_2) in which the copied firmware is stored. When there is no problem on the copied firmware stored in the firmware backup block 40_2, the controller 130 may normally execute the firmware so that the memory system can perform a basic operation.

The controller 130 may recover the original firmware stored in the firmware block of the memory device 150. If there is no physical damage to the firmware block in the memory device 150, the firmware may be recovered in the same block (same physical location). If there is physical damage to the firmware block, the controller 130 may either use the copied firmware stored in the firmware backup block or select and establish a new firmware block storing the original firmware among plural blocks of the memory device 150.

For an emergency operation of the memory system illustrated in FIG. 5, the copied firmware stored in the firmware backup block should be free from critical problems. For safety of the copied firmware, the memory device 150 may include the test block 40_4 (see FIG. 1).

Figure 6:
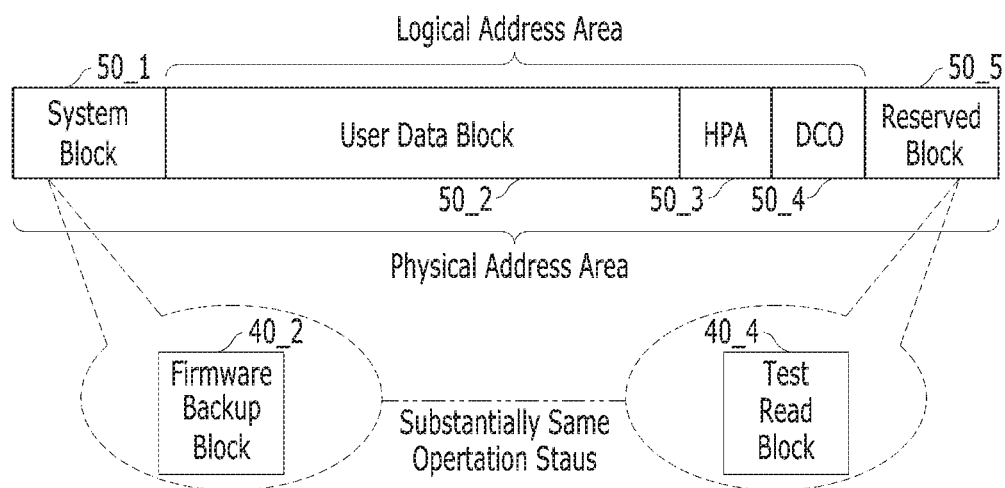
FIG. 6 is a diagram illustrating a data structure used in a memory system in accordance with an embodiment of the disclosure.

FIG. 6 illustrates internal logical configuration of the memory device 150. The memory device 150 illustrated in FIG. 1 through FIG. 5 is described in terms of a logical storage device, not a physical component.

Referring to FIG. 6, the memory device 150 may include a system area 50_1, a user data area 50_2 and a reserved area 50_5.

Specifically, the system area 50_1 is a space in which the firmware block 40_1, the firmware backup block 40_2, and the like described in FIG. 1 may be included. The system area 50_1 is a physical address area accessible by using a physical address only, such as a physical block address of the memory device 150, not a logical address used by a computing device or a host. Thus, even if the memory system including the memory device 150 is associated with the computing device, the user may not be able to access the system area 50_1 via the computing device. The system area 50_1 may have limited access. That is, it may only be accessed by a special instruction or a program. The system area 50_1 may include basic information for recognizing hardware configuration in the memory system 110 or the memory device 150, firmware for supporting basic operations of the memory system 110, and the like.

The user data area 50_2 may store user data or the like to be transmitted from/to a computing device with which the memory system is associated. Representative data included in the user data area 50_2 may include an operating system (OS), file system information, an application program, or the like.

The user data area 50_2 is a logical address area that can be accessed by using a logical address such as a logical block address or the like. For example, a logical block address (LBA), which is used in a logical block addressing method, may be in a format used for a computing device or a host to specify a location of data recorded in a storage device. In the case of a conventional hard disk, an addressing method indicating a physical structure in a hard disk, such as a cylinder, a head, and a sector (a Cylinder-Head-Sector, CHS) was used. However, the addressing method corresponding to the physical structure of the hard disk has reached the limit as the storage capacity of the hard disk increases. In such a large-capacity storage device, the address can be specified in a manner that plural sectors are arranged in a logical sequence in a row, and the plural sectors are numbered (for example, in order from 0), regardless of the physical structure of the hard disk. While a computing device (e.g., host 10, see FIGS. 2 to 3) can transfer or point a piece of data with a logical block address (LBA), the memory system 110 should match and manage computing device's logical block address with a physical location such as a physical address, which can indicate an actual location at which the actual data is stored inside the memory device 150. Such information for associating a logical address with a physical address may be included in metadata or map data, which may be distinguishable from a piece of user data stored or read through the host 102.

The reserved area 50_5 in the memory device 150 can be used to store information for an operation with a computing device or another system which is associated with the memory system, or can be used for other configuration embedded in the memory system, in accordance with an embodiment. For example, in the reserved area 50_5, an error correction code (ECC) for the ECC unit 138 the like can be stored. In addition, the reserved area 50_5 may include the dedicated test block 40_4 described in FIG. 1.

Like the system area 50_1, the reserved area 50_5 is a physical address area accessible by a physical address only such as a physical block address. The memory system 110 stores data used for supporting plural operations required or necessary for a manufacturing process, a process of being configured or mounted on the host 102 or a computing device or an operation engaged or associated with the host 102 or a computing device, in the reserved area 50_5. While the system area 50_1 is used to support the basic operation of the memory system, the reserve area 50_5 may be used to extend operation(s) supported by the memory system.

On the other hand, in accordance with an embodiment, the memory device 150 may include at least one of a host protection area (HPA) 50_3 or a device configuration overlay (DCO) 50_4. Herein, the host protection area (HPA) has been suggested from a technology supported by the Advanced Technology Attachment (ATA)-4 standard. The device configuration overlay (DCO) 50_4 has been supported from the ATA-6 standard. The ATA may include a standard technology of an interface used in a laptop or desktop computer, and may be referred to as an Integrated Device Environment (IDE) or Enhanced IDE (EIDE) method.

The host protection zone (HPA) 50_3 can be used mainly for a BIOS diagnostic utility, a system boot, and a system recovery. For example, the host protection areas (HPA) 50_3 may not be accessible via the BIOS of the host 102. That is, it may be an area of the memory system that is not visible or open to the operating system (OS) and is not modified usually by a user. The host protection area (HPA) 50_3 can support a system recovery without a separate medium such as CD or DVD.

The device configuration overlay (DCO) 50_4 can be used by the memory system manufacturer to adjust the disk size. For example, each manufacturer may have storage capacities of 300 GB, 500 GB, 750 GB, 1 TB, etc., depending on a model of the memory system. The device configuration overlay (DCO) 50_4 can be made to look like a memory system made in several sizes, such as 60 GB, 100 GB, 200 GB, 500 GB, or 1 TB, even though the memory system has been not differently manufactured depend upon its storage capacity. The device configuration overlay (DCO) 50_4 may also be inaccessible via the BIOS of the host 102, but may be accessible through special commands defined by the manufacturer of the memory system 110.

In accordance with an embodiment, the firmware backup block 40_2 may be located in the system area 50_1 while the dedicated test block 40_4 may be located in the reserve area 50_5. In FIG. 1, the firmware backup block 40_2 and the dedicated test block 40_4 have substantially the same operating state such as the same number of erase/write (E/W) cycles or the same number of program/erase (P/E) cycles).

Although not shown, in accordance with an embodiment, the memory device 150 may support an IDE or EIDE scheme as well as Small Computer System Interface (SCSI) scheme. The areas in the memory device 150 may be allocated or allocated differently depending on a configuration or an operation method supported by the memory system 110.

Figure 7:
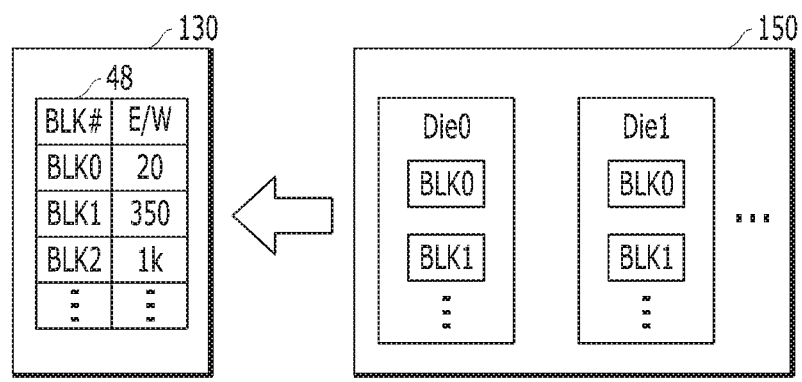
FIG. 7 is a diagram a method for determining a dedicated test block.

FIG. 7 illustrates a method regarding how to determine a dedicated test block. Referring to FIG. 7, the controller 130 may receive a piece of information regarding memory blocks included in the memory device 150.

The memory device 150 may include a plurality of dies (Die0, Die1, . . . ). Each die may include a plurality of blocks (BLK0, BLK1, . . . ). The controller 130 may receive operation information about a plurality of blocks in the memory device 150. For example, the operation information may include about erase/write (E/W) cycles or a program/erase (P/E) cycles performed.

In FIG. 7, it is assumed that the controller 130 receives information of the blocks BKL0, BKL1, . . . in the first die (Die0) of the memory device 150. In FIG. It is assumed that the number of E/W cycles of the first to third blocks BKL0, BKL1, BKL2 in the first die Die0 of the memory device 150 are 20, 350, and 1000 (1 k), respectively.

When the first to third blocks BKL0, BKL1, BKL2 in the first die Die0 are included in the reserve area, the controller 130 can determine one of the first to third blocks BKL0, BKL1, BKL2 (E/W cycle) as the dedicated test block 40_4 based on which has substantially the same state (e.g., substantially the same number of E/W cycles) as the firmware backup block 40_2.

In a manufacturing or initialization process, the firmware block 40_1 and the firmware backup block 40_2 in the memory system, described in FIG. 1, can be established prior to the dedicated test block 40_4. As described above, the controller 130 may recognize the erase/write (E/W) cycle limit or the program/erase (P/E) cycle limit of the firmware backup block 40_2, and search for a block having substantially the same characteristic among blocks included in the reserve area. The block found through such search can be designated as the dedicated test block 40_4.

Referring to FIGS. 1 to 7, when the dedicated test block 40_4 is determined in the above-described embodiment, the controller 130 can access the dedicated test block 40_4 to check data retention of the dedicated test block 40_4, and estimate data retention of the firmware backup block 40_2 based on the data retention of the dedicated test block 40_4. Referring to FIG. 7, since the dedicated test block 40_4 may have substantially same erase/write (E/W) cycle or program/erase (P/E) cycle with the firmware backup block 40_2, it can be presumed that the data retentions of two blocks are also substantially the same with each other. The controller 130 can access the dedicated test block 40_4 under a set operating condition or environment, while controller's access to the firmware backup block 40_2 does not occur. For this reason, the firmware backup block 40_2 may be free from read disturb compared to the dedicated test block 40_4. The retention status of data stored in the dedicated test block 40_4 may be slightly less retainable than the copied firmware stored in the firmware backup block 40_2. Therefore, a method for determining data retention of the firmware backup block 40_2 based on the dedicated test block 40_4 can enhance or increase safety or reliability of the copied firmware or the firmware backup block 40_2.

When it is determined that an estimated retention state of the copied firmware stored in the firmware backup block 40_2 is out of a specified range or above a threshold, the controller 130 may perform a recovery operation of the firmware backup block 40_2. After recovering the firmware backup block 40_2, the controller 130 can recover the dedicated test block 40_4.

Figure 8:
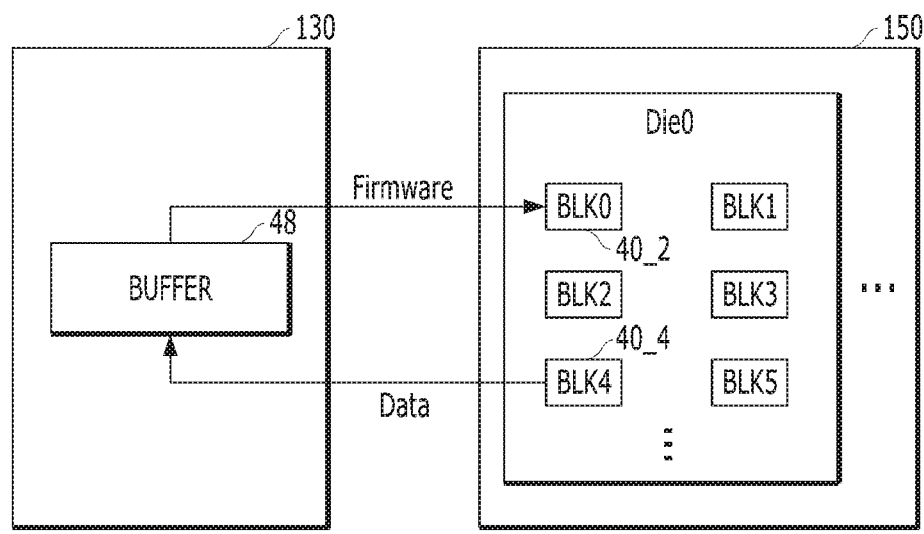
FIG. 8 is a diagram illustrating a first example of recovery operations regarding a copied firmware block and a dedicated test block.

FIG. 8 illustrates a first example of a recovery operation against the firmware backup block and the test dedicated block.

Referring to FIG. 8, it is assumed that a first block BLK0 included in the first die Die0 of the memory device 150 is designated as the firmware backup block 40_2, and a fifth block BLK4 included in the first die Die0 is designated as the dedicated test block 40_4. The firmware backup block 40_2 and the dedicated test block 40_4 may be located on the same die (e.g., the first die Die0). Further, as above described, physical locations of the firmware backup block 40_2 and the dedicated test block 404 can be fixed.

The controller 130 may use the buffer 48 to recover data stored in the firmware backup block 40_2 and the dedicated test block 40_4. In an embodiment, the buffer 48 may correspond to the memory 144 described in FIGS. 2 and 3.

When it is determined that recovery of the firmware copy block 40_2 and the test block 40_4 is necessary, the controller 130 can copy data stored in the firmware backup block 40_2 and the dedicated test block 40_4 into the buffer 48. Thereafter, the controller 130 is configured to erase the data in the firmware backup block 40_2 and the dedicated test block 40_4, and reprogram the data stored in the buffer 48 to the firmware copy block 40_2 and the test block 40_4. The physical positions of the firmware backup block 40_2 and the test block 40_4 need not change, as a result of the recovery process of the firmware backup block 40_2 and the dedicated test block 40_4. The physical locations of the firmware backup block 40_2 and the dedicated test block 40_4 can be fixed. Further, the erase/write (E/W) cycle count or the program/erase (P/E) cycle count of the firmware backup block 40_2 and the dedicated test block 40_4 can be maintained substantially the same with each other.

Figure 9:
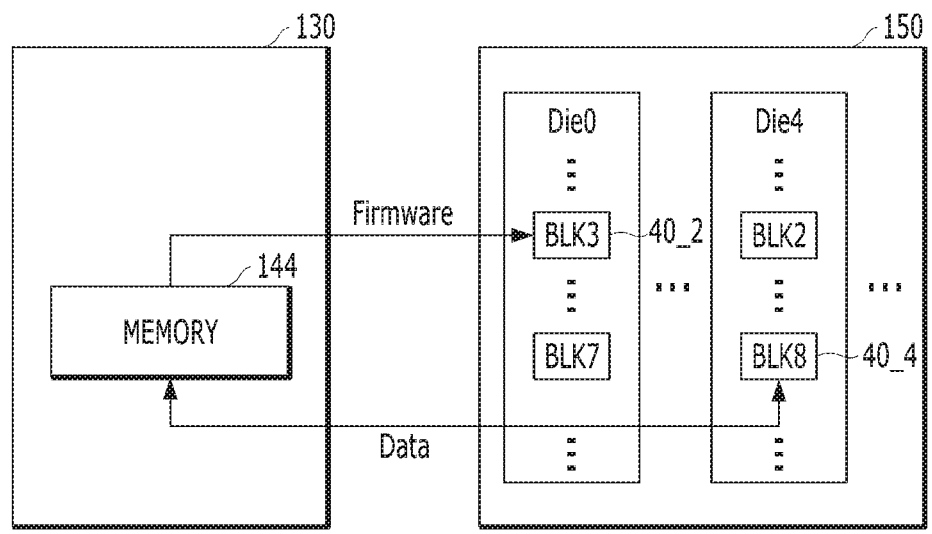
FIG. 9 is a diagram illustrating a second example of recovery operations regarding a copied firmware block and a dedicated test block.

FIG. 9 illustrates a second example of a recovery operation to the firmware backup block and the dedicated test block.

Referring to FIG. 9, it is assumed that the fourth block BLK3 included in the first die Die0 of the memory device 150 is designated as the firmware backup block 40_2, and the ninth block BLK8 included in the fourth die Die4 is designated as the dedicated test block 40_4. Unlike the example described in FIG. 8, the firmware backup block 40_2 and the test dedicated block 40_4 may be arranged on different dies. As described above, the physical locations of the firmware backup block 40_2 and the test block 40_4 can be not changed.

The controller 130 can use the buffer 48 (or the memory 144 shown in FIGS. 2 and 3) to recover the firmware backup block 40_2 and the dedicated test block 40_4.

In addition, unlike the example described in FIG. 8, the original firmware is already loaded into the controller 130 from the firmware block 40_1 or the firmware backup block 40_2. Thus, the controller 130 can use the already loaded firmware without copying the firmware stored in the firmware backup block 40_2. For example, in the case of restoring the firmware backup block 40_2, data (the copied firmware) in the firmware backup block 40_2 can be erased without copying the data in the firmware copy block 40_2 into the buffer 48 or the memory 144. The firmware already loaded can be copied into the firmware backup block 40_2.

On the other hand, since data in the test block 40_4 includes information that can be specified by the controller 130, unlike in the firmware backup block 40_2, the controller 130 may not need to load the data in the memory 144. Therefore, the controller 130 copies the data in the dedicated test block 40_4 to the buffer 38 or the memory 144, then erases the dedicated test block 40_4, and re-programs the data copied in the memory 144 to the dedicated test block 40_4.

In the embodiment shown in FIG. 9, physical locations of the firmware backup block 40_2 and the dedicated test block 40_4 can be fixed through processes of recovering or restoring the firmware backup block 40_2 and the dedicated test block 40_4, as in the embodiment described in FIG. 8. Further, the erase/write (E/W) cycles or the program/erase (P/E) cycles regarding the firmware backup block 40_2 and the dedicated test block 40_4 can be maintained substantially the same with each other.

FIG. 10 illustrates an exemplary operation performed through the firmware of the memory system. Operation based on the firmware may vary depending on whether the memory system is mounted on a mobile device, a notebook computer, or a computing device such as a desktop.

Referring to FIG. 10, the operation of the memory system via firmware includes setting a subject platform 91, performing hardware abstraction 93, loading a bootable image 95, abandoning control and handing over control to a computing device which is associated or engaged with the memory device 97, and controlling a firmware data relevant block 99.

The setting step 91 of the subject platform may be performed by preparing an environment for booting an operating system (OS), thereby confirming whether the subject platform has been initialized.

In this step, exact core type and platform should be found and recognized because the same executable image can be performed on different cores or platforms. By way of example but not limitation, the type of core may be stored in the 0th register of a co-processor. The type of platform may be determined by checking whether a specific peripheral device exists or reading information stored in the chip.

In addition, in accordance with an embodiment, in step 91 of setting the subject platform, diagnostic software may be used to determine whether a hardware component is defective.

In addition, in accordance with an embodiment, in step 91 of setting the subject platform, any problem of the hardware found through the diagnostic software may be debugged according to debugging code or the like.

The step 93 of hardware abstraction may be performed through a hardware abstract layer (HAL), which is a software layer that hides hardware through a set of defined programming interfaces. By way of example but not limitation, the hardware abstraction layer (HAL) may include software or drivers that enable a processor within the controller 130 to communicate with specific peripheral hardware.

The step 95 of loading a bootable image may include forwarding or executing an operating system or an application program included in the user data area to a host or a computing device that is engaged or associated with the memory system. Operating systems or application programs may be of various types, and there may be differences in a way they are executed depending on their type. In addition, the firmware functionality may vary depending on a type of media used to store the boot image. For example, a type that stores an operating system or an application program may be a Flash ROM File System (FFS), a binary image, a Common Object File Format (COFS), or an Executable and Linking Format (ELF).

The step 97 of handing over (or passing) control to a computing device that is engaged with the memory system may be performed by a boot loader included in the firmware. The step of handing over the control (step 97) may include a step of passing control of the recognized platform from the firmware into the operating system or the application program.

The step 99 of controlling the firmware data relevant block can include the steps of determining data states (data retentions) regarding the firmware block 40_1 and the firmware backup block 40_2 described in FIG. 1, and recovering the firmware block 40_1 and the firmware backup block 40_2 if necessary. For example, the process of recovering the firmware block 40_1 may be performed through the operation described with reference to FIG. 5, and the process of recovering the firmware backup block 40_2 may be performed through the operations of FIGS. 8 and 9.

FIG. 11 illustrates a firmware control or management method of the memory system.

Referring to FIG. 11, a method of controlling firmware in a memory system can include accessing a test subject block (e.g., the dedicated test block shown in FIG. 1) located in a reserved area corresponding to a firmware backup block storing a copied firmware in a system area of a memory device (step 83), checking data retention of the test subject block (step 85), and recovering a firmware backup block in response to the data retention (step 87).

The operation method of the memory system may further include checking whether a specific operating condition is met or satisfied (step 81). Firmware management may be performed at any time during the use of the memory system in accordance with an embodiment of the disclosure. However, when it is determined that data stored in the firmware block or the firmware backup block is normal or safe, the operation for firmware control or management may not need to be performed. Accordingly, the operation for firmware management can be performed periodically (e.g., one month or six months, etc.). In addition, the operation for firmware management may be performed after an abnormal operation or an unusual event occurs in the memory system. Abnormal operations or unusual events in the memory system may damage a hardware component or the memory device in the memory system. In this case, the firmware management operation may be performed to check whether retention of data stored in the firmware block or the firmware backup block is normal.

In addition, the method of operation of the memory system may further include, after recovering the firmware backup block, recovering the test subject block (step 89). Referring to FIGS. 8 and 9, it is possible to prevent loss of data in the test subject block, and to maintain operation statuses of the test subject block and the firmware backup block which are substantially the same as each other in terms of use characteristics.

In accordance with an embodiment, a memory device including a plurality of blocks can be divided into a system area including a firmware block storing firmware and at least one firmware backup block storing copied firmware, a user data area and a reserved area including a test subject block. The user data area in the memory device is a space corresponding to a logical block address. However, a logical block address is not assigned to the system area and a reserve area, which are accessible by a physical block address only.

Although not shown, the step 85 of checking the data retention may include checking data retention of the test subject block to estimate or determine a retention status of the copied firmware in the firmware copy block. This may be possible when the test subject block and the firmware copy block have substantially the same operating states such as the erase/write (E/W) cycles or the program/erase (P/E) cycles. To this end, physical block addresses regarding the firmware block, the firmware backup block, and the test subject block need not be changed but instead may remain fixed.

Although not shown, the step 87 of recovering the firmware backup block may include copying firmware stored in the firmware backup block into a buffer when a retention status of data contained in the test subject block is not within a set range, erasing the firmware backup block, and reprogramming the copied firmware in the buffer to the firmware backup block. In another embodiment for recovering the firmware copy block, the firmware loaded in the firmware block may be copied to the firmware backup block as described in FIG. 9.

The step 89 of recovering the test subject block includes copying data of the test subject block in the reserve area into the buffer, erasing the test subject block, and rewriting the data in the buffer to the test subject block.

Figure 12:
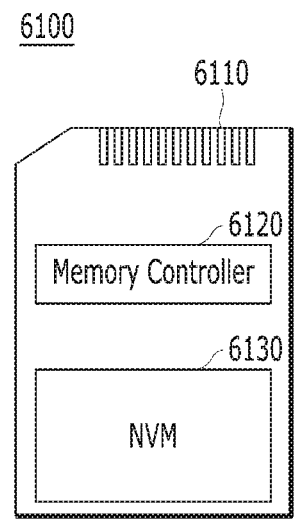
FIGS. 12 to 20 are block diagrams schematically illustrating other data processing systems, each of which includes a memory system, in accordance with an embodiment of the disclosure.

In FIG. 12, another example of the data processing system including the memory system in accordance with an embodiment is shown. FIG. 12 schematically illustrates a memory card system to which the memory system is applied.

Referring to FIG. 12, the memory card system 6100 may include a memory controller 6120, a memory device 6130 and a connector 6110.

The memory controller 6120 may be connected to the memory device 6130 embodied as a nonvolatile memory. The memory controller 6120 may be configured to access the memory device 6130. By way of example but not limitation, the memory controller 6120 may be configured to control read, write, erase and background operations of the memory device 6130. The memory controller 6120 may be configured to provide an interface between the memory device 6130 and a host, and use firmware for controlling the memory device 6130. That is, the memory controller 6120 may correspond to the controller 130 of the memory system 110 described with reference to FIGS. 1 and 3, and the memory device 6130 may correspond to the memory device 150 of the memory system 110 described with reference to FIGS. 1 and 5.

Thus, the memory controller 6120 may include a RAM, a processor, a host interface, a memory interface and an error correction unit. The memory controller 130 may further include the elements shown in FIGS. 1 to 3.

The memory controller 6120 may communicate with an external device, for example, the host 102 of FIG. 1 through the connector 6110. For example, as described with reference to FIGS. 1 to 3, the memory controller 6120 may be configured to communicate with an external device under one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (ESDI), Integrated Drive Electronics (IDE), Firewire, universal flash storage (UFS), WIFI and Bluetooth. Thus, the memory system and the data processing system may be applied to wired/wireless electronic devices, particularly mobile electronic devices.

The memory device 6130 may be implemented by a nonvolatile memory. For example, the memory device 6130 may be implemented by any of various nonvolatile memory devices, such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-MRAM). The memory device 6130 may include a plurality of dies as in the memory device 150 of FIG. 5.

The memory controller 6120 and the memory device 6130 may be integrated into a single semiconductor device. For example, the memory controller 6120 and the memory device 6130 may construct a solid state driver (SSD) by being integrated into a single semiconductor device. In another embodiment, the memory controller 6120 and the memory device 6130 may construct a memory card, such as a PC card (PCMCIA: Personal Computer Memory Card International Association), a compact flash (CF) card, a smart media card (e.g., a SM and a SMC), a memory stick, a multimedia card (e.g., a MMC, a RS-MMC, a MMCmicro and an eMMC), an SD card (e.g., a SD, a miniSD, a microSD and a SDHC) and/or a universal flash storage (UFS).

Figure 13:
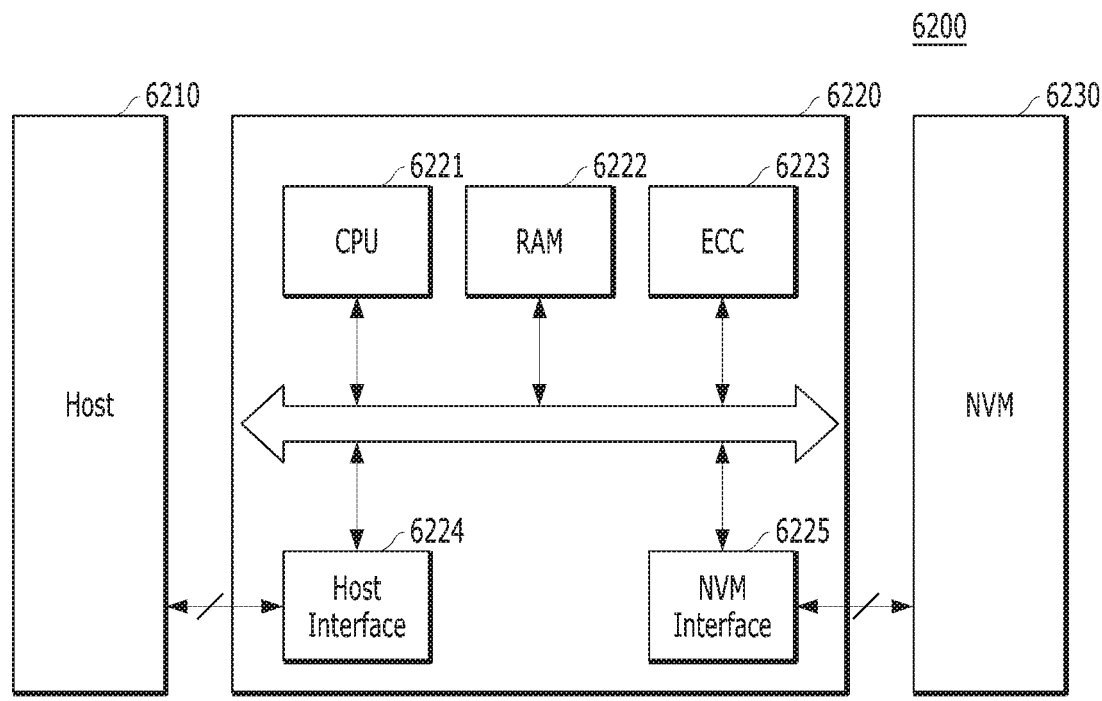

FIG. 13 is a diagram schematically illustrating another example of the data processing system including the memory system in accordance with an embodiment.

Referring to FIG. 13, the data processing system 6200 may include a memory device 6230 having one or more nonvolatile memories and a memory controller 6220 for controlling the memory device 6230. The data processing system 6200 illustrated in FIG. 13 may serve as a storage medium such as a memory card (CF, SD, micro-SD or the like) or USB device, as described with reference to FIGS. 1 and 2. The memory device 6230 may correspond to the memory device 150 in the memory system 110 illustrated in FIGS. 1 and 5. The memory controller 6220 may correspond to the controller 130 in the memory system 110 illustrated in FIGS. 1 and 5.

The memory controller 6220 may control a read, write or erase operation on the memory device 6230 in response to a request of the host 6210. The memory controller 6220 may include one or more CPUs 6221, a buffer memory such as RAM 6222, an ECC circuit 6223, a host interface 6224 and a memory interface such as an NVM interface 6225.

The CPU 6221 may control overall operations on the memory device 6230, for example, read, write, file system management and bad page management operations. The RAM 6222 may be operated according to control of the CPU 6221. The RAM 6222 may be used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the memory device 6230 to operate at high speed.

The ECC circuit 6223 may correspond to the ECC unit 138 of the controller 130 illustrated in FIG. 1. As described with reference to FIG. 1, the ECC circuit 6223 may generate an ECC (Error Correction Code) for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. The ECC circuit 6223 may correct an error using the parity bit. For example, as described with reference to FIG. 1, the ECC circuit 6223 may correct an error using the LDPC code, BCH code, turbo code, Reed-Solomon code, convolution code, RSC or coded modulation such as TCM or BCM.

The memory controller 6220 may exchange data with the host 6210 through the host interface 6224. The memory controller 6220 may exchange data with the memory device 6230 through the NVM interface 6225. The host interface 6224 may be connected to the host 6210 through a PATA bus, SATA bus, SCSI, USB, PCIe or NAND interface. The memory controller 6220 may have a wireless communication function with a mobile communication protocol such as WiFi or Long Term Evolution (LTE). The memory controller 6220 may be connected to an external device, for example, the host 6210 or another external device, and then exchange data with the external device. Particularly, as the memory controller 6220 is configured to communicate with the external device through one or more of various communication protocols, the memory system and the data processing system may be applied to wired/wireless electronic devices, particularly a mobile electronic device.

Figure 14:
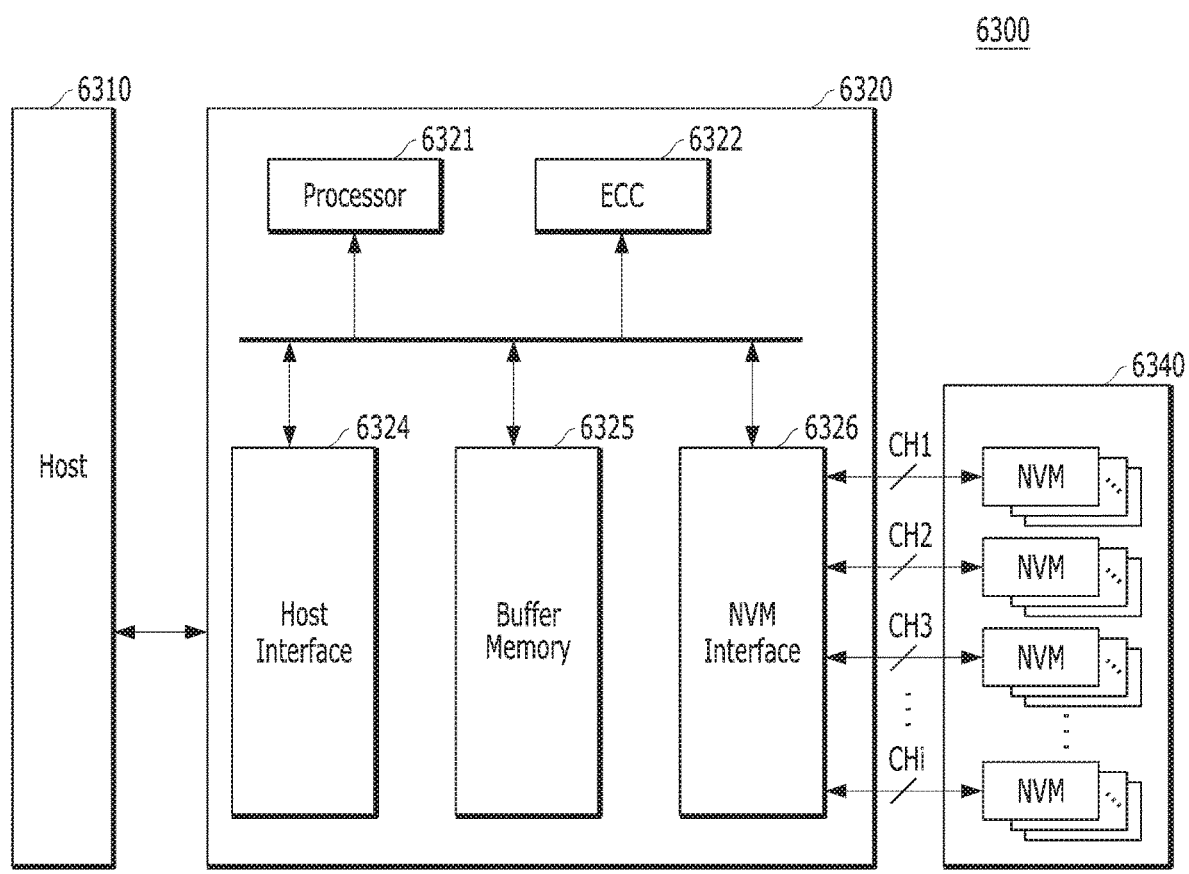

FIG. 14 is a diagram schematically illustrating another example of the data processing system including the memory system in accordance with an embodiment. FIG. 14 schematically illustrates an SSD to which the memory system is applied.

Referring to FIG. 14, the SSD 6300 may include a controller 6320 and a memory device 6340 including a plurality of nonvolatile memories. The controller 6320 may correspond to the controller 130 in the memory system 110 of FIGS. 1 and 2. The memory device 6340 may correspond to the memory device 150 in the memory system of FIGS. 1 and 5.

More specifically, the controller 6320 may be connected to the memory device 6340 through a plurality of channels CH1 to CHi. The controller 6320 may include one or more processors 6321, a buffer memory 6325, an ECC circuit 6322, a host interface 6324 and a memory interface, for example, a nonvolatile memory interface 6326.

The buffer memory 6325 may temporarily store data provided from the host 6310 or data provided from a plurality of flash memories NVM included in the memory device 6340, or temporarily store meta data of the plurality of flash memories NVM, for example, map data including a mapping table. The buffer memory 6325 may be embodied by volatile memories such as DRAM, SDRAM, DDR SDRAM, LPDDR SDRAM and GRAM or nonvolatile memories such as FRAM, ReRAM, STT-MRAM and PRAM. FIG. 14 illustrates that the buffer memory 6325 is disposed in the controller 6320. However, in another embodiment, the buffer memory 6325 may be a separate component disposed externally to the controller 6320.

The ECC circuit 6322 may calculate an ECC value of data to be programmed to the memory device 6340 during a program operation. The ECC circuit 6322 may perform an error correction operation on data read from the memory device 6340 based on the ECC value during a read operation. The ECC circuit 6322 may perform an error correction operation on data recovered from the memory device 6340 during a failed data recovery operation.

The host interface 6324 may provide an interface function with an external device, for example, the host 6310. The nonvolatile memory interface 6326 may provide an interface function with the memory device 6340 connected through the plurality of channels.

Furthermore, a plurality of SSDs 6300 to which the memory system 110 of FIGS. 1 and 5 is applied may be provided to embody a data processing system, for example, RAID (Redundant Array of Independent Disks) system. The RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300. The RAID controller may output data corresponding to the write command to the selected SSDs 6300. Furthermore, when the RAID controller performs a read operation in response to a read command provided from the host 6310, the RAID controller may select one or more memory systems or SSDs 6300 according to a plurality of RAID levels, that is, RAID level information of the read command provided from the host 6310 in the SSDs 6300. The RAID controller may provide data read from the selected SSDs 6300 to the host 6310.

Figure 15:
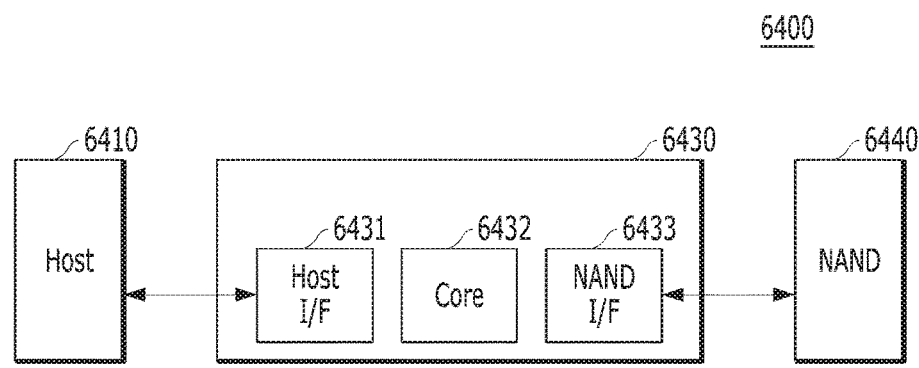

FIG. 15 is a diagram schematically illustrating another example of the data processing system including the memory system in accordance with an embodiment. FIG. 15 schematically illustrates an embedded Multi-Media Card (eMMC) to which the memory system is applied.

Referring to FIG. 15, the eMMC 6400 may include a controller 6430 and a memory device 6440 embodied by one or more NAND flash memories. The controller 6430 may correspond to the controller 130 in the memory system 110 of FIGS. 1 and 2. The memory device 6440 may correspond to the memory device 150 in the memory system 110 of FIGS. 1 and 5.

More specifically, the controller 6430 may be connected to the memory device 6440 through a plurality of channels. The controller 6430 may include one or more cores 6432, a host interface 6431 and a memory interface, for example, a NAND interface 6433.

The core 6432 may control overall operations of the eMMC 6400. The host interface 6431 may provide an interface function between the controller 6430 and the host 6410. The NAND interface 6433 may provide an interface function between the memory device 6440 and the controller 6430. For example, the host interface 6431 may serve as a parallel interface, for example, MMC interface as described with reference to FIG. 1. Furthermore, the host interface 6431 may serve as a serial interface, for example, UHS ((Ultra High Speed)-I/UHS-II) interface.

FIGS. 16 to 19 are diagrams schematically illustrating other examples of the data processing system including the memory system in accordance with embodiments. FIGS. 16 to 19 schematically illustrate UFS (Universal Flash Storage) systems to which the memory system is applied.

Referring to FIGS. 16 to 19, the UFS systems 6500, 6600, 6700, 6800 may include hosts 6510, 6610, 6710, 6810, UFS devices 6520, 6620, 6720, 6820 and UFS cards 6530, 6630, 6730, 6830, respectively. The hosts 6510, 6610, 6710, 6810 may serve as application processors of wired/wireless electronic devices, particularly mobile electronic devices, the UFS devices 6520, 6620, 6720, 6820 may serve as embedded UFS devices, and the UFS cards 6530, 6630, 6730, 6830 may serve as external embedded UFS devices or removable UFS cards.

The hosts 6510, 6610, 6710, 6810, the UFS devices 6520, 6620, 6720, 6820 and the UFS cards 6530, 6630, 6730, 6830 in the respective UFS systems 6500, 6600, 6700, 6800 may communicate with external devices, for example, wired/wireless electronic devices, particularly mobile electronic devices through UFS protocols, and the UFS devices 6520, 6620, 6720, 6820 and the UFS cards 6530, 6630, 6730, 6830 may be embodied by the memory system 110 illustrated in FIGS. 1 and 5. For example, in the UFS systems 6500, 6600, 6700, 6800, the UFS devices 6520, 6620, 6720, 6820 may be embodied in the form of the data processing system 6200, the SSD 6300 or the eMMC 6400 described with reference to FIGS. 13 to 16, and the UFS cards 6530, 6630, 6730, 6830 may be embodied in the form of the memory card system 6100 described with reference to FIG. 12.

Furthermore, in the UFS systems 6500, 6600, 6700, 6800, the hosts 6510, 6610, 6710, 6810, the UFS devices 6520, 6620, 6720, 6820 and the UFS cards 6530, 6630, 6730, 6830 may communicate with each other through an UFS interface, for example, MIPI M-PHY and MIPI UniPro (Unified Protocol) in MIPI (Mobile Industry Processor Interface). Furthermore, the UFS devices 6520, 6620, 6720, 6820 and the UFS cards 6530, 6630, 6730, 6830 may communicate with each other through various protocols other than the UFS protocol, for example, an UFDs, a MMC, a SD, a mini-SD, and a micro-SD.

Figure 16:
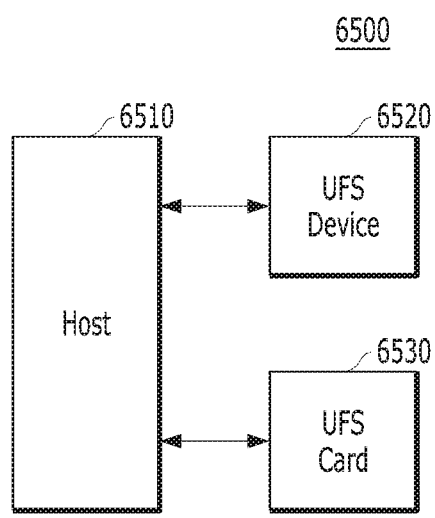

In the UFS system 6500 illustrated in FIG. 16, each of the host 6510, the UFS device 6520 and the UFS card 6530 may include UniPro. The host 6510 may perform a switching operation in order to communicate with the UFS device 6520 and the UFS card 6530. In particular, the host 6510 may communicate with the UFS device 6520 or the UFS card 6530 through link layer switching, for example, L3 switching at the UniPro. The UFS device 6520 and the UFS card 6530 may communicate with each other through link layer switching at the UniPro of the host 6510. In the embodiment of FIG. 16, the configuration in which one UFS device 6520 and one UFS card 6530 are connected to the host 6510 is illustrated. However, in another embodiment, a plurality of UFS devices and UFS cards may be connected in parallel or in the form of a star to the host 6410. The form of a star is an arrangement where a single centralized component is coupled to plural devices for parallel processing. A plurality of UFS cards may be connected in parallel or in the form of a star to the UFS device 6520 or connected in series or in the form of a chain to the UFS device 6520.

Figure 17:
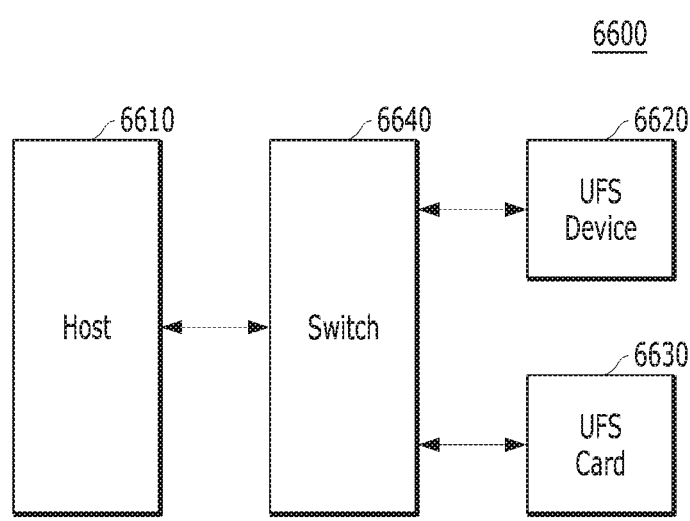

In the UFS system 6600 illustrated in FIG. 17, each of the host 6610, the UFS device 6620 and the UFS card 6630 may include UniPro, and the host 6610 may communicate with the UFS device 6620 or the UFS card 6630 through a switching module 6640 performing a switching operation, for example, through the switching module 6640 which performs link layer switching at the UniPro, for example, L3 switching.

The UFS device 6620 and the UFS card 6630 may communicate with each other through link layer switching of the switching module 6640 at UniPro. In the embodiment of FIG. 17, the configuration in which one UFS device 6620 and one UFS card 6630 are connected to the switching module 6640 is illustrated. However, in another embodiment, a plurality of UFS devices and UFS cards may be connected in parallel or in the form of a star to the switching module 6640, and a plurality of UFS cards may be connected in series or in the form of a chain to the UFS device 6620.

Figure 18:
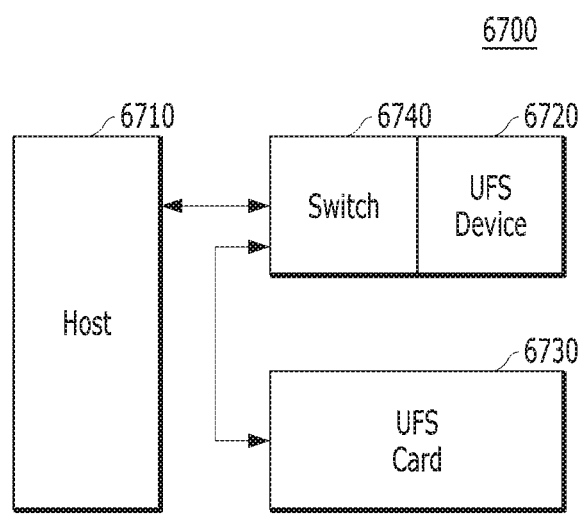

In the UFS system 6700 illustrated in FIG. 18, each of the host 6710, the UFS device 6720 and the UFS card 6730 may include UniPro, and the host 6710 may communicate with the UFS device 6720 or the UFS card 6730 through a switching module 6740 performing a switching operation, for example, through the switching module 6740 which performs link layer switching at the UniPro, for example, L3 switching. The UFS device 6720 and the UFS card 6730 may communicate with each other through link layer switching of the switching module 6740 at the UniPro, and the switching module 6740 may be integrated as one module with the UFS device 6720 inside or outside the UFS device 6720. In the embodiment of FIG. 18, the configuration in which one UFS device 6720 and one UFS card 6730 are connected to the switching module 6740 is illustrated. However, in another embodiment, a plurality of modules each including the switching module 6740 and the UFS device 6720 may be connected in parallel or in the form of a star to the host, 6710 or connected in series or in the form of a chain to each other. Furthermore, a plurality of UFS cards may be connected in parallel or in the form of a star to the UFS device 6720.

Figure 19:
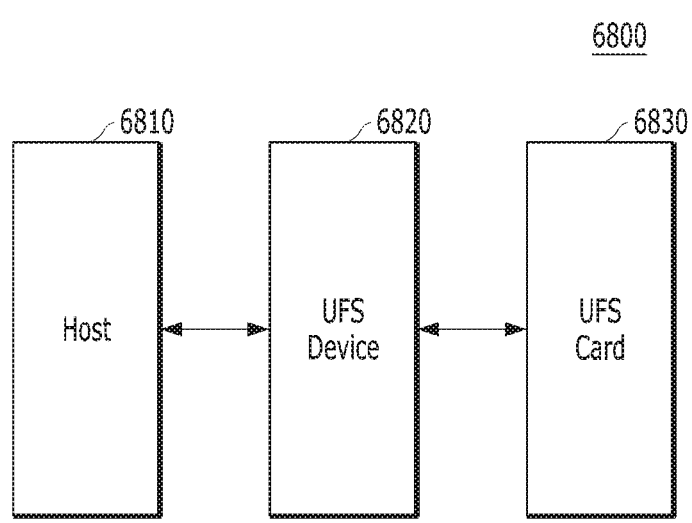

In the UFS system 6800 illustrated in FIG. 19, each of the host 6810, the UFS device 6820 and the UFS card 6830 may include M-PHY and UniPro. The UFS device 6820 may perform a switching operation in order to communicate with the host 6810 and the UFS card 6830. In particular, the UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target ID (Identifier) switching operation. The host 6810 and the UFS card 6830 may communicate with each other through target ID switching between the M-PHY and UniPro modules of the UFS device 6820. In the embodiment of FIG. 19, the configuration in which one UFS device 6820 is connected to the host 6810 and one UFS card 6830 is connected to the UFS device 6820 is illustrated. However, in another embodiment, a plurality of UFS devices may be connected in parallel or in the form of a star to the host 6810, or connected in series or in the form of a chain to the host 6810, and a plurality of UFS cards may be connected in parallel or in the form of a star to the UFS device 6820, or connected in series or in the form of a chain to the UFS device 6820.

Figure 20:
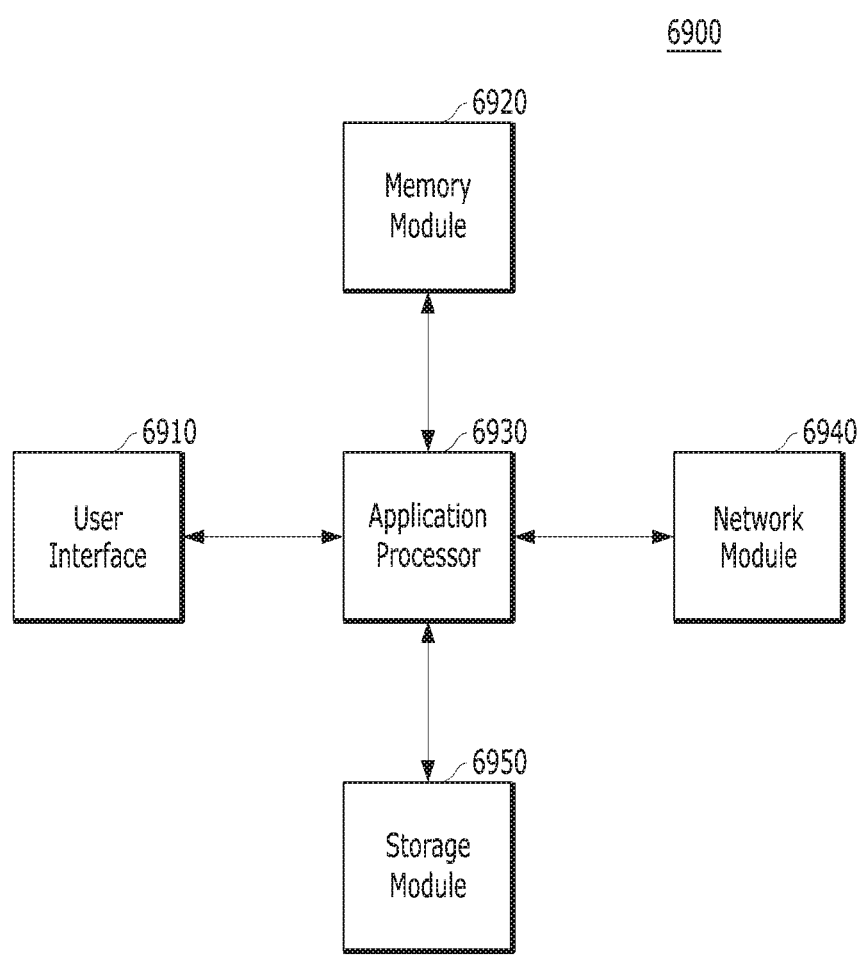

FIG. 20 is a diagram schematically illustrating another example of the data processing system including the memory system in accordance with an embodiment of the present invention. FIG. 20 is a diagram schematically illustrating a user system to which the memory system is applied.

Referring to FIG. 20, the user system 6900 may include an application processor 6930, a memory module 6920, a network module 6940, a storage module 6950 and a user interface 6910.

More specifically, the application processor 6930 may drive components included in the user system 6900, for example, an OS, and include controllers, interfaces and a graphics engine which control the components included in the user system 6900. The application processor 6930 may be provided as System-on-Chip (SoC).

The memory module 6920 may be used as a main memory, work memory, buffer memory or cache memory of the user system 6900. The memory module 6920 may include a volatile RAM such as DRAM, SDRAM, DDR SDRAM, DDR2 SDRAM, DDR3 SDRAM, LPDDR SDARM, LPDDR2 SDRAM or LPDDR3 SDRAM or a nonvolatile RAM such as PRAM, ReRAM, MRAM or FRAM. For example, the application processor 6930 and the memory module 6920 may be packaged and mounted, based on POP (Package on Package).

The network module 6940 may communicate with external devices. For example, the network module 6940 may not only support wired communication, but also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), thereby communicating with wired/wireless electronic devices, particularly mobile electronic devices. Therefore, the memory system and the data processing system, in accordance with an embodiment of the present invention, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, a NOR flash and a 3D NAND flash, and provided as a removable storage medium such as a memory card or external drive of the user system 6900. The storage module 6950 may correspond to the memory system 110 described with reference to FIGS. 1 and 5. Furthermore, the storage module 6950 may be embodied as an SSD, an eMMC and an UFS which are described above.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a monitor.

Furthermore, when the memory system 110 of FIGS. 1 and 5 is applied to a mobile electronic device of the user system 6900, the application processor 6930 may control overall operations of the mobile electronic device. The network module 6940 may serve as a communication module for controlling wired/wireless communication with an external device. The user interface 6910 may display data processed by the application processor 6930 on a display/touch module of the mobile electronic device. Further, the user interface 6910 may support a function of receiving data from the touch panel.

In accordance with embodiments described above, a memory system, a data processing system, and an operation method thereof enable indirectly checking the status of a backup block storing a copy of firmware and performing replication or movement of the backup block whenever it is determined that replication or movement of the firmware is necessary, so that operation stability and reliability of the memory system can be improved or enhanced.

In addition, an embodiment can determine or estimate the status of the backup block storing the firmware based on relevant information such as status of a test block in a reserved area, and can avoid or reduce influence such as read disturb on the backup block storing the firmware or a system data block storing peripheral firmware or system information. Thus, embodiments provide a method and an apparatus capable of performing a test, a diagnosis or a check for the backup block without affecting operation statuses of the backup block in the memory system.

While the present invention has been illustrated and described with respect to the specific embodiments, it will be apparent to those skilled in the art in light of the present disclosure that various changes and modifications may be made without departing from the spirit and scope of the invention as defined in the following claims.

What is claimed is:

1. A memory system, comprising:
   a memory device including a plurality of memory blocks divided into a system region, a user data region and a reserved region, wherein the system region includes a first block storing original firmware and a second block storing copied firmware, and the reserved region includes a dedicated test block having substantially a same amount of erase/write cycles (E/W) or program/erase (P/E) cycles as that of the second block; and a controller configured to access the dedicated test block for determining a retention status of the copied firmware in the second block based on a data retention status of data stored in the dedicated test block, and to update the copied firmware in the second block based on the retention status of the second block.

2. The memory system according to claim 1, wherein the user data region includes a plurality of spaces each being accessible based on a logical address through a map table, and the system region and the reserved region includes another plurality of spaces each being accessible based on a physical address but not a logical address.

3. The memory system according to claim 2, further comprising a computing device engaged with the memory system, wherein the user data region is capable of storing at least one of an operating system and a piece of user data, which is used by the computing device engaged with the memory system.

4. The memory system according to claim 3,
wherein the original firmware includes at least one of program code, an instruction or an engine for supplying an interface between the operating system and at least one hardware component of the memory system, and
wherein the original firmware is configured to be executed automatically when power is supplied, and configured to be upgraded according to a specific event.

5. The memory system according to claim 4, wherein the original firmware includes a boot loader configured to pass control of the memory system to the computing device engaged with the memory system to operate the operating system.

6. The memory system according to claim 1,
wherein the first block, the second block and the dedicated test block have distinct physical locations in the memory device, and
wherein, when the original firmware in the first block is not executed properly, the controller accesses and executes the copied firmware stored in the second block.

7. The memory system according to claim 1, wherein the controller is configured to access the dedicated test block, check the data retention status of the dedicated test block, and determine the retention status of the copied firmware based on the data retention status of the dedicated test block.

8. The memory system according to claim 7, wherein, when the data retention status of the dedicated test block in the reserved region is outside of a specific range, the controller is configured to copy the copied firmware from the second block to a buffer, erase the second block, and re-program the copied firmware stored in the buffer into the second block.

9. The memory system according to claim 7, wherein, after the copied firmware is re-programed in the second block, the controller is configured to copy test data stored in the dedicated test block of the reserved region into a buffer, erase the dedicated test block, and re-program the test data to the dedicated test block.

10. An apparatus for controlling firmware in a memory system including at least one processor and at least one memory including computer program code, wherein the at least one memory and the computer program code are configured, with the at least one processor, to cause the apparatus to:
copy, by the at least one processor, original firmware stored in a first block of a system region to a copied firmware in a second block of the system region;
access, by the at least one processor, a dedicated test block located in a reserved region of a memory device, wherein the dedicated test block having substantially a same amount of erase/write cycles (E/W) or program/erase (P/E) cycles as that of a second block storing the copied firmware in a system region of the memory device;
determine, by the at least one processor, a data retention status of the dedicated test block based on a data retention status of data stored in the dedicated test block; and
recover, by the at least one processor, the second block storing the copied firmware based on a result of the determine operation,
wherein the memory device comprises a plurality of memory blocks which are divided into the system region, a user data region and the reserved region.

11. A method for operating a memory system, comprising:
copying, by a controller, original firmware stored in a first block of a system region to a copied firmware in a second block of the system region;
accessing, by the controller, a dedicated test block located in a reserved region of a memory device and having substantially a same amount of erase/write cycles (E/W) or program/erase (P/E) cycles as that of the second block storing the copied firmware in the system region of the memory device;
determining a data retention status of the dedicated test block based on a retention status of data stored in the dedicated test block; and
recovering the second block storing the copied firmware based on a result of the determining operation,
wherein the memory device comprises a plurality of memory blocks which are divided into the system region, a user data region and the reserved region.

12. The method according to claim 11, further comprising: checking whether an operation status of the memory system meets a set condition.

13. The method according to claim 11, further comprising: recovering the dedicated test block after recovering the second block storing the coped firmware.

14. The method according to claim 12, wherein the user data region includes a plurality of spaces each being accessible based on a logical address through a map table, and the system region and the reserved region includes another plurality of spaces each being accessible based on a physical address but not a logical address.

15. The method according to claim 12,
wherein the first block storing the original firmware, the second block storing the copied firmware and the dedicated test block have distinct physical locations in the memory device, and
wherein the dedicated test block and the second block storing the copied firmware have substantially a same limit in available erase/write(E/W) cycles or program/erase(P/E) cycles.

16. The method according to claim 11, wherein the recovering the second block storing the copied firmware includes when the data retention status of the dedicated test block in the reserved region is outside a specific range,
copying the copied firmware from the second block in the system region to a buffer,
erasing the second block in the system region, and
re-programing the copied firmware stored in the buffer into the second block in the system region.

17. The method according to claim 11, wherein recovering the dedicated test block includes:

copying test data stored in the dedicated test block of the reserved region into a buffer,
erasing the dedicated test block, and
re-programming the test data to the dedicated test block.

\* \* \* \* \*